(12) United States Patent
Widmer et al.

(10) Patent No.: US 9,739,844 B2
(45) Date of Patent: Aug. 22, 2017

(54) GUIDANCE AND ALIGNMENT SYSTEM AND METHODS FOR ELECTRIC VEHICLE WIRELESS CHARGING SYSTEMS

(71) Applicant: QUALCOMM Incorporated, San Diego, CA (US)

(72) Inventors: Hans Peter Widmer, Wohlenschwil (CH); Lukas Sieber, Olten (CH); Andreas Daetwyler, Unterentfelden (CH)

(73) Assignee: QUALCOMM Incorporated, San Diego, CA (US)

( * ) Notice: Subject to any disclaimer, the term of this patent is extended or adjusted under 35 U.S.C. 154(b) by 183 days.

(21) Appl. No.: 14/515,291

(22) Filed: Oct. 15, 2014

(65) Prior Publication Data

US 2016/0025821 A1    Jan. 28, 2016

Related U.S. Application Data

(60) Provisional application No. 62/029,092, filed on Jul. 25, 2014.

(51) Int. Cl.
*G01R 33/02* (2006.01)
*G01R 33/00* (2006.01)
(Continued)

(52) U.S. Cl.
CPC ...... *G01R 33/0206* (2013.01); *B60L 11/1829* (2013.01); *G01R 33/0047* (2013.01);
(Continued)

(58) Field of Classification Search
CPC .. G01R 33/028; G01R 33/02; G01R 33/0283; H02J 2001/004; H04B 5/00
(Continued)

(56) References Cited

U.S. PATENT DOCUMENTS 5,498,948 A * 3/1996 Bruni ................. B60L 11/1816
                                                              320/108
5,617,003 A    4/1997 Odachi et al.
(Continued)

FOREIGN PATENT DOCUMENTS

WO    WO-2011046403 A2    4/2011
WO    WO-2014011776 A2    1/2014

OTHER PUBLICATIONS

International Search Report and Written Opinion—PCT/US2015/040417—ISA/EPO—Oct. 5, 2015.
(Continued)

*Primary Examiner* — Tung X Nguyen
*Assistant Examiner* — Dominic Hawkins
(74) *Attorney, Agent, or Firm* — Knobbe, Martens, Olson & Bear, LLP

(57) ABSTRACT

Guidance and alignment systems are disclosed for wireless charging systems to assist in aligning the transmitter and receiver inductive power transfer (IPT) couplers. These systems guide positioning and alignment to provide sufficient coupling between the transmitter and receiver IPT couplers. Exemplary systems provide a magnetic field sensor, magnetic field generator, and magnetic vectoring to determine a position of an electric vehicle or a wireless charging base. In a magnetic vectoring system, an alignment system comprising at least three coils (or similar circuits) on a magnetically permeable substrate receives a positioning magnetic field including modulated information signals and processes the received signal to generate an output for determining a position of the positioning magnetic field source relative to the magnetic field sensor position. The alignment system may further comprise a similar structure that generates the positioning magnetic field, that may
(Continued)

include modulated information signals, based on input signals.

30 Claims, 12 Drawing Sheets

(51) Int. Cl.
| | | |
|---|---|---|
| *H01F 38/14* | (2006.01) | |
| *H02J 50/12* | (2016.01) | |
| *H02J 50/90* | (2016.01) | |
| *B60L 11/18* | (2006.01) | |

(52) U.S. Cl.
CPC .............. *H01F 38/14* (2013.01); *H02J 50/12* (2016.02); *H02J 50/90* (2016.02); *B60L 11/182* (2013.01); *Y02T 10/7005* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
USPC .................................. 324/258, 259, 244, 200
See application file for complete search history.

(56) References Cited

U.S. PATENT DOCUMENTS

| | | | |
|---|---|---|---|
| 5,821,731 A | 10/1998 | Kuki et al. | |
| 7,042,411 B2 * | 5/2006 | Yagi | H01Q 21/24 343/787 |
| 8,178,998 B2 * | 5/2012 | Dellacona | G05F 1/335 307/104 |
| 9,106,083 B2 * | 8/2015 | Partovi | H02J 7/025 |
| 9,230,732 B2 * | 1/2016 | Muratov | H01F 38/14 |
| 9,236,758 B2 * | 1/2016 | Fisher | H02J 5/005 |
| 9,325,187 B2 * | 4/2016 | Lee | H02J 7/0052 |
| 9,653,206 B2 * | 5/2017 | Keeling | H01F 38/14 |
| 2007/0241812 A1 * | 10/2007 | Yang | H03F 1/3247 330/75 |
| 2008/0231263 A1 * | 9/2008 | Rebmann | G01D 5/142 324/207.11 |
| 2008/0297107 A1 | 12/2008 | Kato et al. | |
| 2009/0309440 A1 * | 12/2009 | Lieberman | H02N 15/00 310/90.5 |
| 2010/0070219 A1 * | 3/2010 | Azancot | H02J 5/005 702/62 |
| 2010/0161217 A1 | 6/2010 | Yamamoto | |
| 2010/0201315 A1 | 8/2010 | Oshimi et al. | |
| 2010/0230197 A1 | 9/2010 | Ortmann et al. | |
| 2010/0235006 A1 | 9/2010 | Brown | |
| 2010/0277121 A1 | 11/2010 | Hall et al. | |
| 2010/0301841 A1 | 12/2010 | Anderson | |
| 2010/0305427 A1 | 12/2010 | Huber et al. | |
| 2011/0254503 A1 | 10/2011 | Widmer et al. | |
| 2012/0032632 A1 * | 2/2012 | Soar | H01F 38/14 320/108 |
| 2012/0161535 A1 * | 6/2012 | Jung | H01F 38/14 307/104 |
| 2012/0235506 A1 | 9/2012 | Kallal et al. | |
| 2012/0262002 A1 * | 10/2012 | Widmer | H04B 5/0037 307/104 |
| 2013/0069587 A1 * | 3/2013 | Kuk | H02J 5/005 320/108 |
| 2013/0175984 A1 * | 7/2013 | Yamazaki | H04B 5/0037 320/108 |
| 2013/0181535 A1 * | 7/2013 | Muratov | H01F 38/14 307/104 |
| 2013/0181724 A1 * | 7/2013 | Teggatz | G01N 27/02 324/629 |
| 2013/0249312 A1 * | 9/2013 | Uchida | H01F 27/365 307/104 |
| 2014/0084857 A1 * | 3/2014 | Liu | H02J 7/025 320/108 |
| 2014/0111019 A1 * | 4/2014 | Roy | G01V 3/081 307/104 |
| 2014/0266180 A1 * | 9/2014 | Ausserlechner | G01R 15/20 324/251 |
| 2014/0339923 A1 * | 11/2014 | Simopoulos | H02J 5/005 307/149 |
| 2015/0008752 A1 * | 1/2015 | Boys | B60L 11/182 307/104 |
| 2015/0028687 A1 * | 1/2015 | Ichikawa | H01F 38/14 307/104 |
| 2015/0115762 A1 * | 4/2015 | Rozman | G01D 5/2066 310/180 |
| 2015/0180285 A1 * | 6/2015 | Yamakawa | B60L 11/182 307/104 |
| 2015/0365137 A1 * | 12/2015 | Miller | H02J 5/005 307/104 |
| 2015/0380970 A1 * | 12/2015 | Vu | H02J 7/025 320/108 |

OTHER PUBLICATIONS

Roemer P.B., et al., "The NMR Phased Array," Magnetic Resonance in Medicine, John Wiley & Sons, Inc, US, vol. 16, No. 2, Nov. 1, 1990 (Nov. 1, 1990), pp. 192-225, XP000175903.

Waffenschmidt E, "Free Positioning for Inductive Wireless Power System", Energy Conversion Congress and Exposition (ECCE), 2011 IEEE, IEEE, Sep. 17, 2011 (Sep. 17, 2011), pp. 3480-3487, XP032067631.

* cited by examiner

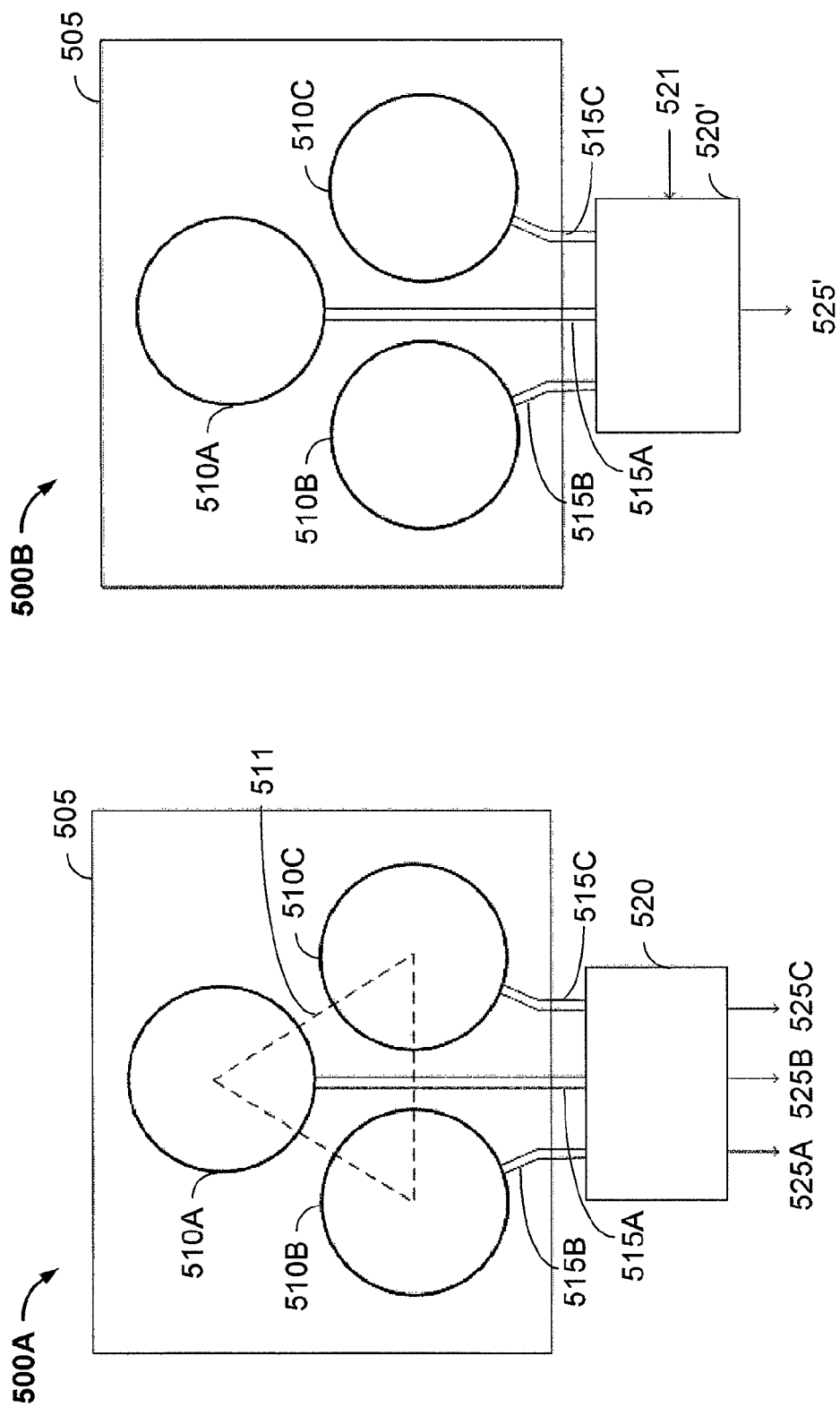

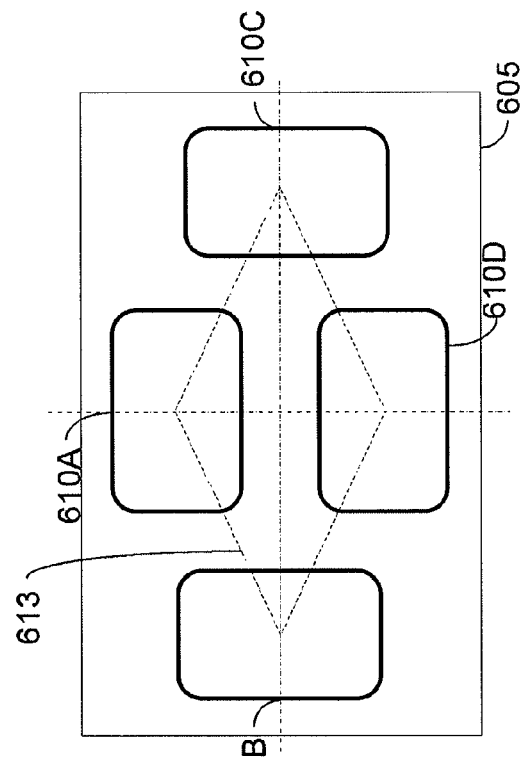
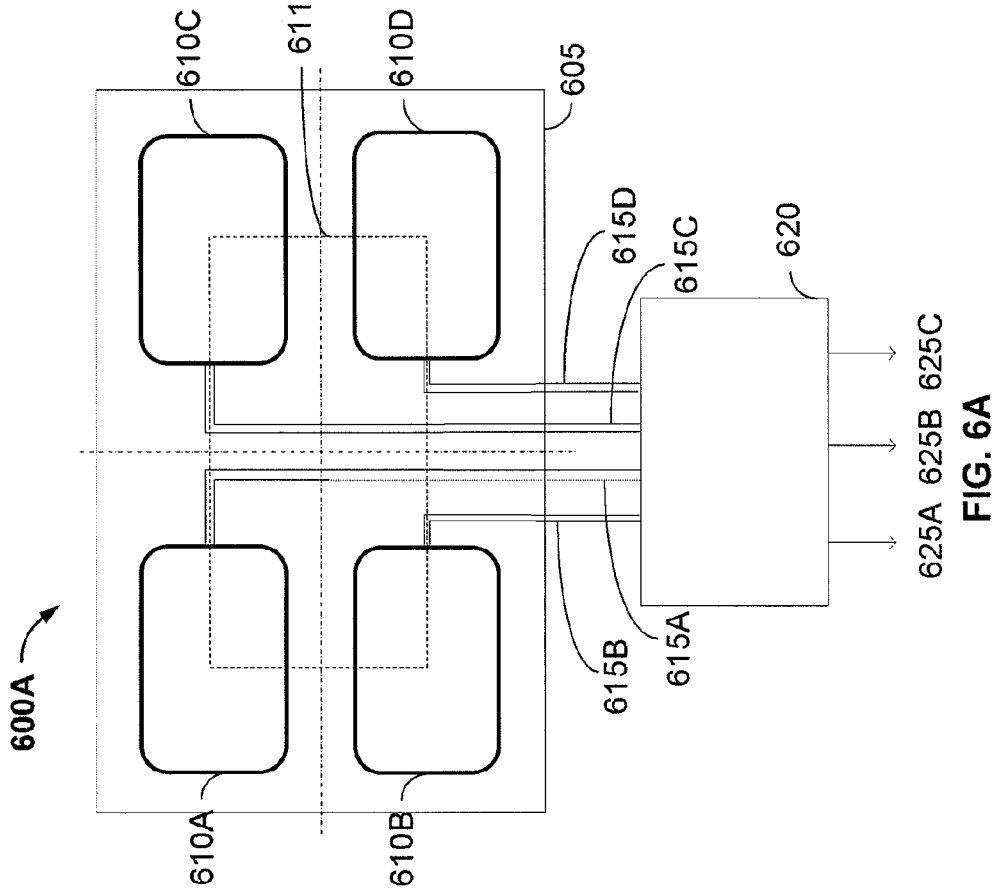
FIG. 6B
FIG. 6A

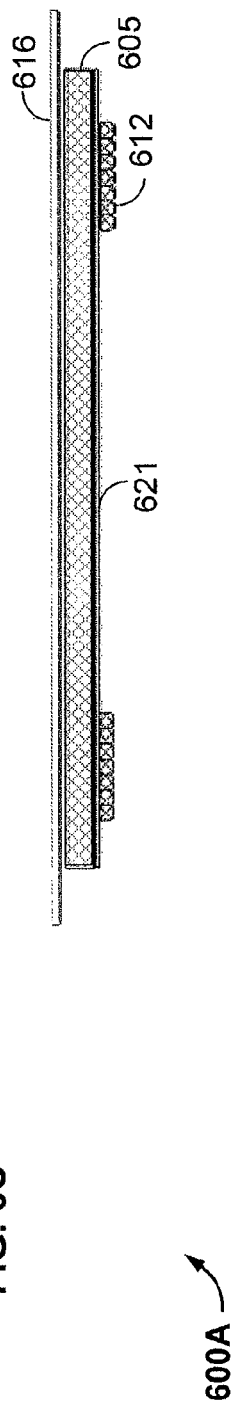
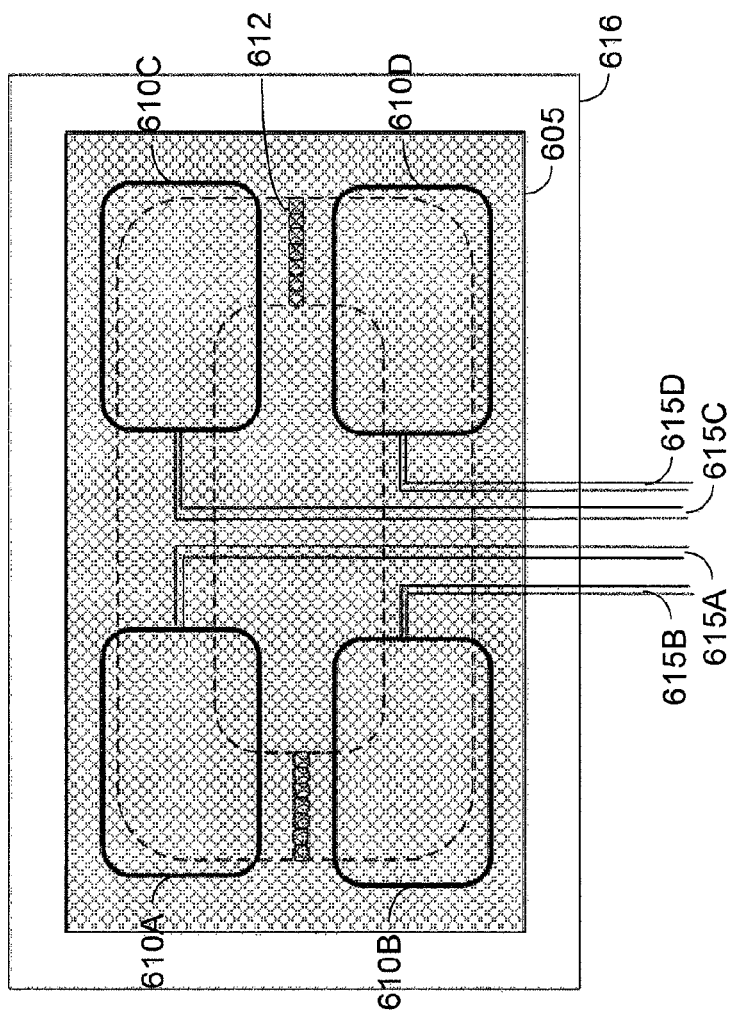
FIG. 6D
FIG. 6C

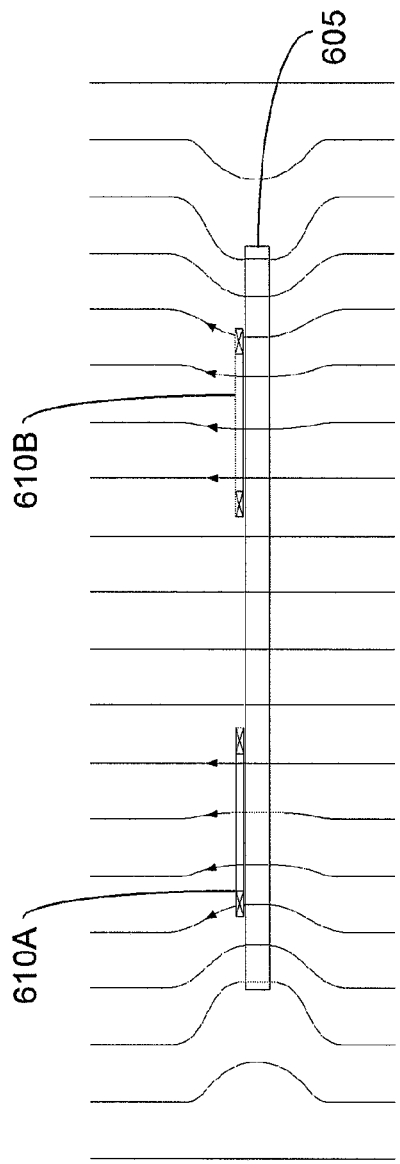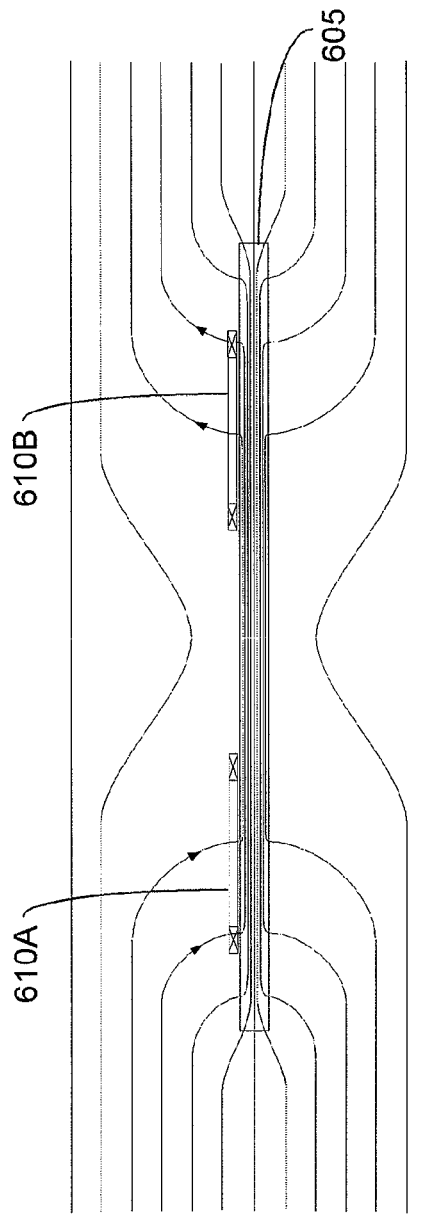
FIG. 7A
FIG. 7B

GUIDANCE AND ALIGNMENT SYSTEM AND METHODS FOR ELECTRIC VEHICLE WIRELESS CHARGING SYSTEMS

CROSS REFERENCE TO RELATED APPLICATIONS

This Application claims the benefit of U.S. Provisional Application No. 62/029,092, filed Jul. 25, 2014, and entitled "GUIDANCE AND ALIGNMENT SYSTEM AND METHODS FOR ELECTRIC VEHICLE WIRELESS CHARGING SYSTEMS" and assigned to the assignee hereof. The disclosure of this prior application is considered part of this application, and is hereby incorporated by reference in its entirety.

TECHNICAL FIELD

The described technology generally relates to wireless power. More specifically, the disclosure is directed to devices, systems, and methods related to wireless power transfer between a ground-based charging unit and a vehicle-based unit and determining a position of an electric vehicle relative to the ground-based charging unit for purposes of guidance and alignment.

BACKGROUND

Chargeable systems, such as electric vehicles, have been introduced that include locomotion power derived from electricity received from an energy storage device such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. It is desirable to provide wireless charging systems that are capable of transferring power in free space (e.g., via a wireless field) to be used to charge the electric vehicle to overcome some of the deficiencies of wired charging solutions. Additionally, wireless charging system should be capable of determining a position of the electric vehicle and/or the charging system to facilitate the transfer of wireless power to a receiver in a most efficient manner possible.

Inductive power transfer (IPT) systems provide one example of wireless transfer of energy. In IPT systems, a primary device (i.e., the transmitter) transmits power to a secondary device (i.e., the receiver). Each of these transmitter and receiver devices may comprise at least one inductive coupler (e.g., IPT coupler), which may comprise a single coil or a multi-coil arrangement of windings of electric current conveying material. In IPT systems, an alternating current in the transmitter produces a magnetic field, which induces an electromotive force in a receiver placed in proximity to the transmitter and accordingly transfers power to the receiver. Typically, frequencies in the VLF or LF frequency bands (e.g., from 20 kHz to 150 kHz) are used for inductive power transfer for electric vehicle charging.

Inductive charging of electric vehicles in the kilowatt range requires relatively tight coupling to be efficient and compliant with regulatory standards. With inductive charging, higher power comes with tighter coupling. Inductive charging of electric vehicles may be used with static charging systems (where the inductive charging takes place while the electric vehicle is motionless) or dynamic charging systems (where the inductive charging takes place while the electric vehicle is in motion). In static system, park assist systems may help drivers overcome alignment issues and increase convenience and charging efficiencies. For example, the park assist system may indicate to the driver when the electric vehicle is parked within the "sweet spot." According to another embodiment, the park assist systems may direct the electric vehicle to automatically park itself with minimal driver intervention. This is particularly valuable for position-critical vehicle charging systems. Guidance and alignment systems may be used to assist drivers to reliably park the electric vehicle within a "sweet-spot" or "tolerance area," which may be an area where the coupling efficiency between the transmitter (on the charging base) and receiver (on the electric vehicle) is at or above a certain threshold or minimum value. The sweet-spot and the charging areas may also be defined according to the emissions that are released into the parking area, e.g. if vehicle is positioned within the sweet spot or tolerance area, the magnetic leakage field as measured in the surrounding of the vehicle satisfies specified limits, e.g., regulatory human exposure limits. Accordingly, systems and methods for providing local positioning based on sensing a low frequency magnetic field that may be generated either by the base charging unit or the electric vehicle charging unit at a frequency preferably below 150 kHz to provide guidance and alignment information are desired.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description," one will understand how the features of the various embodiments of this invention provide advantages that include improved communications between access points and stations in a wireless network.

The embodiments disclosed herein each have several innovative aspects, no single one of which is solely responsible for the desirable attributes of the invention. Without limiting the scope, as expressed by the claims that follow, the more prominent features will be briefly disclosed here. After considering this discussion, one will understand how the features of the various embodiments provide several advantages over current dynamic wireless charging systems.

One aspect of this disclosure provides an apparatus for sensing magnetic field components in a wireless power transfer system. In one aspect, the apparatus comprises a magnetically permeable substrate, at least three co-planar coils disposed on the magnetically permeable substrate, configured to generate signals induced by a received magnetic field, and a processing system operably connected to the coils and configured to generate at least two outputs, based on the signals generated by the coils, the outputs indicative of at least two vector components of the received magnetic field.

Another aspect disclosed in a method of sensing magnetic field components in a wireless power transfer system. The method includes receiving a magnetic field via at least three co-planar coils disposed on a magnetically permeable substrate, generating signals induced by the received magnetic field via the at least three coils, and generating, via a processing system, at least two outputs based on the signals generated by the at least three coils, the output comprising at least two vector components of the received magnetic field.

Another aspect disclosed is an apparatus for sensing magnetic field components in a wireless power transfer system. The apparatus comprises at least three co-planar coils disposed on a magnetically permeable substrate, configured to generate signals induced by a received magnetic field and means for generating at least two outputs based on the signals generated by the at least three co-planar coils, the output comprising at least two vector components of the received magnetic field.

Another aspect disclosed is an apparatus for generating positioning magnetic field signals in a wireless power transfer system. The apparatus comprises a magnetically permeable substrate, at least three co-planar coils disposed on the magnetically permeable substrate, each of the at least three generator coils configured to generate a positioning magnetic field signal, and a processing system configured to control a characteristic of a current of each of the at least three coils, the positioning magnetic field signal indicative of a position of the apparatus with respect to a recipient of the magnetic positioning magnetic field signal.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting. Throughout the drawings, similar symbols typically identify similar components, unless context dictates otherwise. Note that the relative dimensions of the following figures may not be drawn to scale.

FIG. 5A depicts a schematic view of a sensor and detector system having the sense coils disposed on a substrate with a signal combiner and detector having multiple outputs in accordance with an exemplary embodiment.

FIG. 5B depicts a schematic view of a sensor and detection system having the sensors disposed on a magnetically permeable substrate with additional components having a single output in accordance with an exemplary embodiment.

FIG. 6A depicts a schematic view of a sensor and detector system having the sense coils disposed on a substrate with a signal combiner and detector having multiple outputs in accordance with an exemplary embodiment.

FIG. 6B depicts a schematic view of a sensor and detector system having the sense coils disposed on a substrate in accordance with an exemplary embodiment.

FIG. 6C is a schematic profile view of a magnetic field sensing system showing sense coils formed in a PCB in accordance with an exemplary embodiment.

FIG. 6D is a cross-section profile view of a magnetic field sensing system showing sense coils formed in a PCB in accordance with another exemplary embodiment.

FIG. 7A illustrates the effect of the magnetically permeable substrate on the positioning magnetic field visualized by lines of magnetic flux for a field direction that is substantially perpendicular to the plane of the sense coils, in accordance with an exemplary embodiment.

FIG. 7B illustrates the effect of the magnetically permeable substrate on the positioning magnetic field visualized by lines of magnetic flux for a field direction that is substantially parallel to the plane of the sense coils, in accordance with an exemplary embodiment.

DETAILED DESCRIPTION

Figure 1:
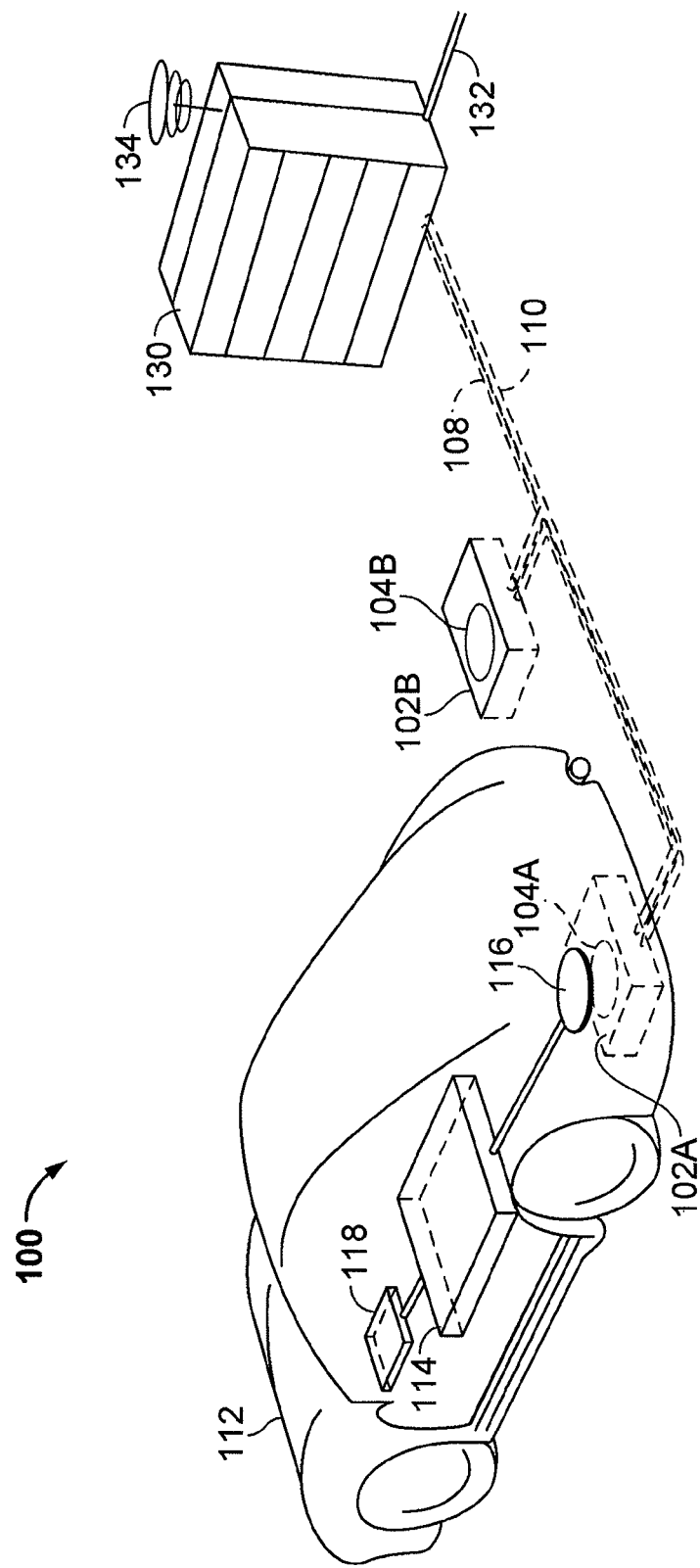
FIG. 1 is a diagram of an exemplary wireless power transfer system for charging an electric vehicle, in accordance with an exemplary embodiment.

The detailed description set forth below in connection with the appended drawings is intended as a description of exemplary embodiments and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. In some instances, some devices are shown in block diagram form.

According to one or more embodiments, the magnetic vectoring methods and systems disclosed herein are contemplated to be integrated into an IPT charging system and preferably into a base subsystem and specifically into the base IPT coupler, i.e., base pad. However, the methods disclosed herein may also apply to non-integrated stand-alone, i.e. discrete, solutions. Magnetic vectoring concepts and solutions disclosed herein may be integrated into a base IPT coupler. They may also apply to vehicle coupler integration.

The methods and systems disclosed herein contemplate both transmit and receive antennas integrated into the base unit according to certain embodiments. However, such methods and systems should not be construed as limited thusly.

Though not specifically described in detail herein, the magnetic vectoring system is connected to the wireless charging control system according to certain embodiments so that the magnetic vectoring system may provide assistance with aligning the IPT coupler of the electric vehicle with the IPT coupler of the base pad.

The exemplary IPT couplers described herein for the purpose of disclosing magnetic vectoring concepts and solutions should be construed as exemplary and not limiting. Such exemplary IPT couplers typically comprise a coil structure, for example made with a Copper Litz wire, a physical core structure, for example comprising a soft ferrite material, and a conductive back plate, for example comprising Aluminum. Physical core antennas including ferromagnetic or ferrimagnetic materials may allow development of a stronger electromagnetic field and improved coupling. In some embodiments, the coil structure may be configured to include an air core. An air core loop antenna may allow the placement of other components within the core area. An example of the IPT coupler considered herein is a "Circular"-type coupler. Though not explicitly shown in this disclosure, a magnetic vectoring system may be integrated within other types of IPT couplers, for example a "DD"-type, a "Bipolar"-type, or a "Solenoid"-type IPT coupler with some modification.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

FIG. 1 is a diagram of an exemplary wireless power transfer system 100 for charging an electric vehicle, in accordance with an exemplary embodiment. The wireless power transfer system 100 enables charging of an electric vehicle 112 while the electric vehicle 112 is parked near a base wireless charging system 102A. Spaces for two electric vehicles are illustrated in a parking area to be parked over corresponding base wireless charging systems 102A and 102B. In some embodiments, a local distribution center 130 may be connected to a power backbone 132 and configured to provide an alternating current (AC) or a direct current (DC) supply through a power link 110 to the base wireless charging system 102A. The base wireless charging system 102A also includes base system induction coils 104A, 104B for wirelessly transferring or receiving power. The electric vehicle 112 may include a battery unit 118, an electric vehicle induction coil 116, and an electric vehicle wireless charging system 114. The electric vehicle induction coil 116 may interact with the base system induction coil 104A for example, via a region of the electromagnetic field generated by the base system induction coil 104A.

In some exemplary embodiments, the electric vehicle induction coil 116 may receive power when the electric vehicle induction coil 116 is located in an energy field produced by the base system induction coil 104A. The field may correspond to a region where energy output by the base system induction coil 104A may be captured by the electric vehicle induction coil 116. For example, the energy output by the base system induction coil 104A may be at a level sufficient to charge or power the electric vehicle 112. In some cases, the field may correspond to the "near field" of the base system induction coil 104A. The near-field may correspond to a region in which there are strong reactive fields resulting from the currents and charges in the base system induction coil 104A that do not radiate power away from the base system induction coil 104A. In some cases the near-field may correspond to a region that is within about $1/2\pi$ of wavelength of the base system induction coil 104A (and vice versa for the electric vehicle induction coil 116) as will be further described below.

Local distribution center 130 may be configured to communicate with external sources (e.g., a power grid) via a communication backhaul 134, and with the base wireless charging system 102A via a communication link 108.

In some embodiments the electric vehicle induction coil 116 may be aligned with the base system induction coil 104A and, therefore, disposed within a near-field region simply by the driver positioning the electric vehicle 112 in sufficient alignment relative to the base system induction coil 104A. In other embodiments, the driver may be given visual feedback, auditory feedback, or combinations thereof to determine when the electric vehicle 112 is properly placed on the "sweet spot" for wireless power transfer. In yet other embodiments, the electric vehicle 112 may be positioned by an autopilot system, which may move the electric vehicle 112 until an alignment error has reached a tolerable or sufficient value. This may be performed automatically and autonomously by the electric vehicle 112 without or with only minimal driver intervention provided that the electric vehicle 112 is equipped with a servo steering wheel, ultrasonic sensors, and intelligence to adjust the vehicle. In still other embodiments, the electric vehicle induction coil 116, the base system induction coil 104A, or a combination thereof may have functionality for displacing and moving the induction coils 116 and 104A relative to each other to more accurately orient or align them and develop sufficient and/or otherwise more efficient coupling there between.

The base wireless charging system 102A may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors may not be needed, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since the electric vehicle 112 may be used as distributed storage devices to stabilize a power grid, a docking-to-grid solution may be used to increase availability of vehicles for Vehicle-to-Grid (V2G) operation.

The wireless power transfer system 100 as described with reference to FIG. 1 may also provide aesthetical and non-impedimental advantages. For example, there may be no charge columns and cables that may impede vehicles and/or pedestrians.

As a further explanation of the vehicle-to-grid capability, the wireless power transmit and receive capabilities may be configured to be reciprocal such that the base wireless charging system 102A transfers power to the electric vehicle 112 and the electric vehicle 112 transfers power to the base wireless charging system 102A, e.g., in times of energy shortfall. This capability may be useful to stabilize the power distribution grid by allowing electric vehicles 112 to contribute power to the overall distribution system in times of energy shortfall caused by over demand or shortfall in renewable energy production (e.g., wind or solar).

Figure 2:
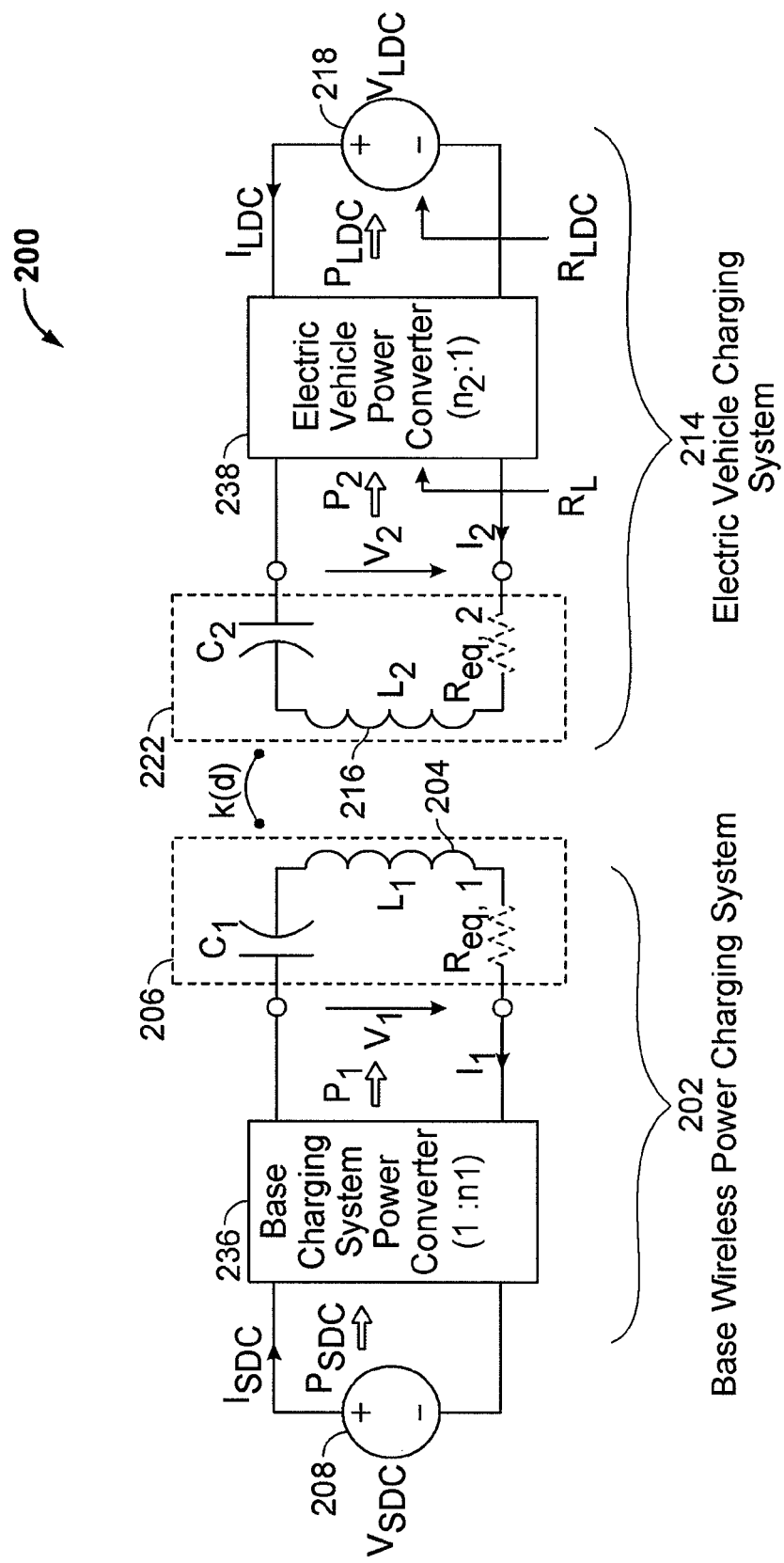
FIG. 2 is a schematic diagram of exemplary wireless power transfer system components in accordance with an exemplary embodiment.

FIG. 2 is a schematic diagram of exemplary system components of the wireless power transfer system 100 of FIG. 1. As shown in FIG. 2, the wireless power transfer system 200 may include a base system transmit circuit 206 including a base system induction coil 204 having an inductance L1. The wireless power transfer system 200 further includes an electric vehicle receive circuit 222 including an electric vehicle induction coil 216 having an inductance L2. Embodiments described herein may use capacitively loaded wire loops (i.e., multi-turn coils) forming a resonant structure that is capable of efficiently coupling energy from a primary structure (transmitter) to a secondary structure (receiver) via a magnetic or electromagnetic near field if both primary and secondary are tuned to a common resonant frequency. The coils may be used for the electric vehicle induction coil 216 and the base system induction coil 204. Using resonant structures for coupling energy may be referred to "magnetic coupled resonance," "electromagnetic coupled resonance," and/or "resonant induction." The operation of the wireless power transfer system 200 will be described based on power transfer from a base wireless power charging system 202 to an electric vehicle (not shown), but is not limited thereto. For example, as discussed above, the electric vehicle may transfer power to the base wireless power charging system 202.

With reference to FIG. 2, a power supply 208 (e.g., AC or DC) supplies power $P_{SDC}$ to the base wireless power charging system 202 to transfer energy to an electric vehicle. The base wireless power charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power P1 to the base system transmit circuit 206 including the capacitor C1 in series with the base system induction coil 204 to emit an electromagnetic field at a desired frequency. The capacitor C1 may be coupled with the base system induction coil 204 either in parallel or in series, or may be formed of several reactive elements in any combination of parallel or series topology. The capacitor C1 may be provided to form a resonant circuit with the base system induction coil 204 that resonates at a desired frequency. The base system induction coil 204 receives the power P1 and wirelessly transmits power at a level sufficient to charge or power the electric vehicle. For example, the power level provided wirelessly by the base system induction coil 204 may be on the order of kilowatts (kW) (e.g., anywhere from 1 kW to 110 kW or higher or lower).

The base system transmit circuit 206 including the base system induction coil 204 and electric vehicle receive circuit 222 including the electric vehicle induction coil 216 may be tuned to substantially the same frequencies and may be positioned within the near-field of an electromagnetic field transmitted by one of the base system induction coil 204 and the electric vehicle induction coil 216. In this case, the base system induction coil 204 and electric vehicle induction coil 216 may become coupled to one another such that power may be transferred to the electric vehicle receive circuit 222 including capacitor C2 and electric vehicle induction coil 216. The capacitor C2 may be provided to form a resonant circuit with the electric vehicle induction coil 216 that resonates at a desired frequency. The capacitor C2 may be coupled with the electric vehicle induction coil 204 either in parallel or in series, or may be formed of several reactive elements in any combination of parallel or series topology. Element k(d) represents the mutual coupling coefficient resulting at coil separation. Equivalent resistances $R_{eq}$,1 and $R_{eq}$,2 represent the losses that may be inherent to the base system and electric vehicle induction coils 204 and 216 and the anti-reactance capacitors C1 and C2. The electric vehicle receive circuit 222 including the electric vehicle induction coil 216 and capacitor C2 receives power P2 and provides the power P2 to an electric vehicle power converter 238 of an electric vehicle charging system 214.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power $P_{LDC}$ to charge the electric vehicle battery unit 218. The power supply 208, base charging system power converter 236, and base system induction coil 204 may be stationary and located at a variety of locations as discussed above. The electric vehicle battery unit 218, electric vehicle power converter 238, and electric vehicle induction coil 216 may be included in an electric vehicle charging system 214 that is part of electric vehicle or part of the battery pack (not shown). The electric vehicle charging system 214 may also be configured to provide power wirelessly through the electric vehicle induction coil 216 to the base wireless power charging system 202 to feed power back to the grid. Each of the electric vehicle induction coil 216 and the base system induction coil 204 may act as transmit or receive induction coils based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle induction coil 216 to the electric vehicle power converter 238. Disconnecting the electric vehicle induction coil 216 may suspend charging and also may adjust the "load" as "seen" by the base wireless power charging system 202 (acting as a transmitter), which may be used to "cloak" the electric vehicle charging system 214 (acting as the receiver) from the base wireless charging system 202. The load changes may be detected if the transmitter includes the load sensing circuit. Accordingly, the transmitter, such as a base wireless charging system 202, may have a mechanism for determining when receivers, such as an electric vehicle charging system 214, are present in the near-field of the base system induction coil 204.

As described above, in operation, during energy transfer towards the vehicle or battery, input power is provided from the power supply 208 such that the base system induction coil 204 generates a field for providing the energy transfer. The electric vehicle induction coil 216 couples to the radiated field and generates output power for storage or consumption by the electric vehicle. As described above, in some embodiments, the base system induction coil 204 and electric vehicle induction coil 216 are configured according to a mutual resonant relationship such that when the resonant frequency of the electric vehicle induction coil 216 and the resonant frequency of the base system induction coil 204 are very close or substantially the same. Transmission losses between the base wireless power charging system 202 and electric vehicle charging system 214 are minimal when the electric vehicle induction coil 216 is located in the near-field of the base system induction coil 204.

As stated, an efficient energy transfer occurs by coupling a large portion of the energy in the near field of a transmitting induction coil to a receiving induction coil rather than propagating most of the energy in an electromagnetic wave to the far-field. When in the near field, a coupling mode may be established between the transmit induction coil and the receive induction coil. The area around the induction coils where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power induction coil. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power induction coil. The base charging system and electric vehicle power converters 236 and 238 may also include a rectifier and switching circuitry to generate a suitable power output to charge the electric vehicle battery unit 218.

The electric vehicle induction coil 216 and base system induction coil 204 as described throughout the disclosed embodiments may be referred to or configured as "loop" antennas, and more specifically, multi-turn loop antennas. The base system and electric vehicle induction coils 204 and 216 may also be referred to herein or be configured as "magnetic" antennas. The term "coils" is intended to refer to a component that may wirelessly output or receive energy for coupling to another "coil." The coil may also be referred to as an "antenna" of a type that is configured to wirelessly output or receive power. As used herein, base system and electric vehicle induction coils 204 and 216 are examples of the exemplary IPT couplers described above.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting induction coil to the receiving induction coil residing within a region (e.g., within a predetermined frequency range of the resonant frequency, or within a predetermined distance of the near-field region) where this near field is established rather than propagating the energy from the transmitting induction coil into free space.

A resonant frequency may be based on the inductance and capacitance of a transmit circuit including an induction coil (e.g., the base system induction coil 204) as described above. As shown in FIG. 2, inductance may generally be the inductance of the induction coil, whereas, capacitance may be added to the induction coil to create a resonant structure at a desired resonant frequency. As a non-limiting example, as shown in FIG. 2, a capacitor may be added in series with the induction coil to create a resonant circuit (e.g., the base system transmit circuit 206) that generates an electromagnetic field. Accordingly, for larger diameter induction coils, the value of capacitance for inducing resonance may decrease as the diameter or inductance of the coil increases. Inductance may also depend on a number of turns of an induction coil. Furthermore, as the diameter of the induction coil increases, the efficient energy transfer area of the near field may increase. Other resonant circuits are possible. As another non limiting example, a capacitor may be placed in parallel between the two terminals of the induction coil (e.g., a parallel resonant circuit). Furthermore an induction coil may be designed to have a high quality (Q) factor to improve the resonance of the induction coil. For example, the Q factor may be 300 or greater.

As described above, according to some embodiments, coupling power between two induction coils that are in the near field of one another is disclosed. As described above, the near field may correspond to a region around the induction coil in which electromagnetic fields exist but may not propagate or radiate away from the induction coil. Near-field coupling-mode regions may correspond to a volume that is near the physical volume of the induction coil, typically within a small fraction of the wavelength. According to some embodiments, electromagnetic induction coils, such as single and multi-turn loop antennas, are used for both transmitting and receiving since magnetic near field amplitudes in practical embodiments tend to be higher for magnetic type coils in comparison to the electric near fields of an electric type antenna (e.g., a small dipole). This allows for potentially higher coupling between the pair. Furthermore, "electric" antennas (e.g., dipoles and monopoles) or a combination of magnetic and electric antennas may be used.

Figure 3:
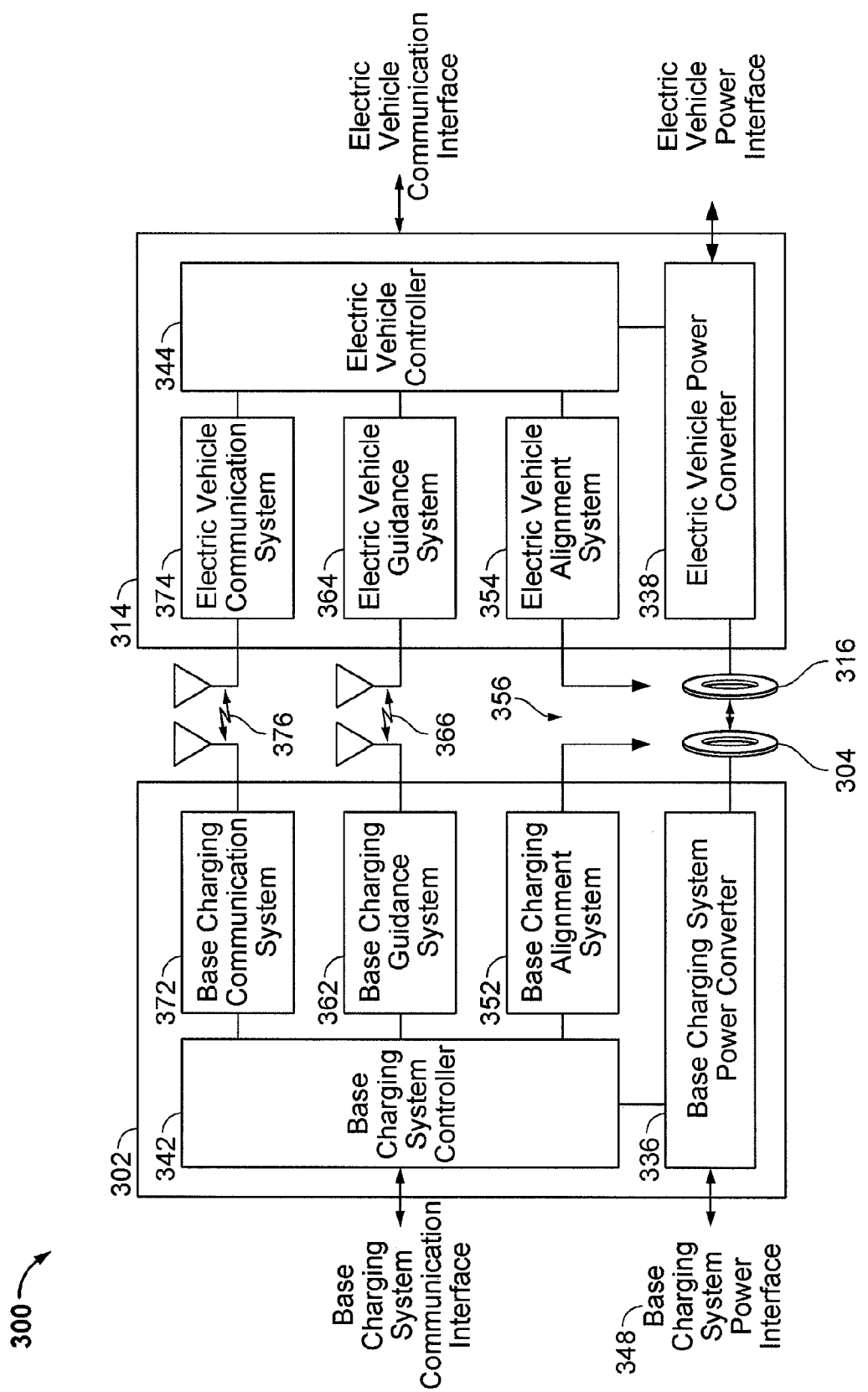
FIG. 3 is a functional block diagram showing exemplary system components of the wireless power transfer system of FIG. 1 in accordance with an exemplary embodiment.

FIG. 3 is a functional block diagram showing exemplary components of wireless power transfer system 300, which may be employed in wireless power transfer system 100 of FIG. 1 and/or wireless power transfer system 200 of FIG. 2. The wireless power transfer system 300 illustrates a communication link 376, a guidance link 366 using, for example, a positioning magnetic field, an alignment mechanism 356 capable of mechanically moving one or both of the base system induction coil 304 and the vehicle system induction coil 316, and base charging and electric vehicle charging alignment systems 352, 354 for the base system induction coil 304 and electric vehicle induction coil 316. The guidance link 366 may be capable of bi-directional or uni-directional signaling. The alignment mechanism 356 may be capable of mechanically manipulating and aligning the movable base system induction coil 304 and/or the movable electric vehicle induction coil 316. As described above with reference to FIG. 2, when energy flows towards the electric vehicle 112, in FIG. 3 a base charging system power interface 348 may be configured to provide power to a base charging system power converter 336 from a power source, such as an AC or DC power supply (not shown). The base charging system power converter 336 may receive AC or DC power from the base charging system power interface 348 to excite the base system induction coil 304 at or near its resonant frequency. The electric vehicle induction coil 316, when in the near field coupling-mode region, may receive energy from the near field coupling mode region to oscillate at or near the resonant frequency. The electric vehicle power converter 338 converts the oscillating signal from the electric vehicle induction coil 316 to a power signal suitable for charging a battery via the electric vehicle power interface.

The base wireless power charging system 302 includes a base charging system controller 342 and the electric vehicle charging system 314 includes an electric vehicle controller 344. The base charging system controller 342 may include a base charging system communication interface to other systems (not shown) such as, for example, a computer, and a power distribution center, or a smart power grid. The electric vehicle controller 344 may include an electric vehicle communication interface to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle charging alignment system 354 through communication link 376 to provide a feedback mechanism for more closely aligning the base system induction coil 304 and electric vehicle induction coil 316, for example via autonomous, mechanical (kinematic alignment), by the electric vehicle or with operator assistance as described herein. Similarly, a base charging guidance system 362 may communicate with an electric vehicle guidance system 364 through communication link 376 and also using a guidance link 366 to provide a feedback mechanism to guide an operator to the charging spot and in aligning the base system induction coil 304 and electric vehicle induction coil 316. In some embodiments, communications link 376 may also comprise a plurality of separate, general-purpose communication channels supported by base charging communication system 372 and electric vehicle communication system 374 for communicating other information between the base wireless power charging system 302 and the electric vehicle charging system 314. This information may include information about electric vehicle characteristics, battery characteristics, charging status, and power capabilities of both the base wireless power charging system 302 and the electric vehicle charging system 314, as well as maintenance and diagnostic data for the electric vehicle. These communication channels may be separate logical channels or separate physical communication channels such as, for example, WLAN, Bluetooth, zigbee, cellular, etc.

Electric vehicle controller 344 may also include a battery management system (BMS) (not shown) that manages charge and discharge of the electric vehicle principal and/or auxiliary battery. As discussed herein, some embodiments of electric vehicle controller 344 may employ a parking assistance system based on microwave, ultrasonic radar, or magnetic vectoring principles, a brake system configured to perform a semi-automatic parking operation, and a steering wheel servo system configured to assist with a largely automated parking "park by wire" that may provide higher parking accuracy and provide sufficient alignment between base system and electric vehicle induction coils 304 and 316. Further, electric vehicle controller 344 may be configured to communicate with electronics of the electric vehicle 112. For example, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

Furthermore, the wireless power transfer system 300 may include detection and sensor systems (not shown). For example, the wireless power transfer system 300 may include sensors for use with systems to properly guide the driver or the vehicle to the charging spot, sensors to mutually align the induction coils with the required separation/coupling, sensors to detect objects that may obstruct the electric vehicle induction coil 316 from moving to a particular height and/or position to achieve coupling, and safety sensors for use with systems to perform a reliable, damage free, and safe operation of the system. For example, a safety sensor may include a sensor for detection of presence of animals or children approaching the base system and electric vehicle induction coils 304, 316 beyond a safety radius, detection of metal objects near the base system induction coil 304 that may be heated up (induction heating), and detection of hazardous events such as incandescent objects on the base system induction coil 304.

The wireless power transfer system 300 may also support plug-in charging via a wired connection. A wired charge port may integrate the outputs of the two different chargers prior to transferring power to or from the electric vehicle. Switching circuits may provide the functionality as needed to support both wireless charging and charging via a wired charge port.

To communicate between a base wireless power charging system 302 and an electric vehicle charging system 314, the wireless power transfer system 300 may use in-band signaling via base system and electric vehicle induction coils 304, 316 and/or out-of-band signaling via communications systems, e.g., RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

In addition, some communication may be performed via the wireless power link without using specific communications antennas. For example, the base system and electric vehicle induction coils 304 and 316 may also be configured to act as wireless communication transmitters. Thus, some embodiments of the base wireless power charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base charging system power converter 336 may include a load sensing circuit (not shown) for detecting the presence or absence of active electric vehicle receivers in the vicinity of the near field generated by the base system induction coil 304. By way of example, a load sensing circuit monitors the current flowing to the power amplifier, which is affected by the presence or absence of active receivers in the vicinity of the near field generated by base system induction coil 304. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some embodiments may be configured to transfer power at a frequency in the range from 10-150 kHz. This low frequency coupling may allow highly efficient power conversion that may be achieved using solid state devices. In addition, there may be less coexistence issues with radio systems compared to other bands.

With respect to induction charging, depending on the energy transfer rate (power level), operating frequency, size and design of the primary and secondary magnetic structures and the distance between them, the flux density in the air gap at some locations may exceed 0.5 mT and may reach several Millitesla. If an object that includes a certain amount of well conductive material (e.g., metal) is inserted into the space between the primary and secondary structures, eddy currents are generated in this object (Lenz's or Faraday's law), that may lead to power dissipation and subsequent heating effects. This induction heating effect depends on the magnetic flux density, the frequency of the alternating magnetic field, the size, shape, orientation and conductivity of the object's conducting structure. When the object is exposed to the magnetic field for a sufficiently long time, it may heat up to temperatures that may be considered hazardous in several regards. One hazard may be self-ignition if the object includes flammable materials or if it is in direct contact with such materials, e.g., a cigarette package including a thin metalized foil. Another hazard may be burning the hand of a person that may pick up such a hot object, e.g., a coin or a key. Another hazard may be damaging the plastic enclosure of the primary or secondary structure, e.g., an object melting into the plastic.

A temperature increase may be also expected in objects including ferromagnetic materials that may be substantially non-conducting but exhibiting a pronounced hysteresis effect or in materials that generate both hysteresis and eddy current losses. As such, detecting such objects is beneficial to avoid corresponding harmful consequences. If the object detection system is integrated within a system for providing wireless power, in response to detecting a harmful object, the system may reduce a power level or shut down until measures may be taken to remove the harmful object.

In certain applications of inductive power transfer such as charging of electric vehicles in domestic and public zones, it may be particularly advantageous for reasons of safety of persons and equipment to be able to utilize magnetic vectoring to assist in positioning of the electric vehicle or the charging base. For example, this may be particularly true in systems where parking an electric vehicle above or near a wireless charger is made more difficult due to weather or other obstacles making it more difficult for a driver of the electric vehicle to park the electric vehicle appropriately using only visual cues.

Sensing a magnetic field for purposes of positioning (i.e., sensing a positioning magnetic field) may comprise at least one of a charging base (i.e., the device acting as the source for the inductive power or wireless power charging source) or an electric vehicle receiving unit (i.e., the device being wirelessly charged via inductive power). One of the charging base or the electric vehicle may generate an alternating magnetic field that can be sensed by a system of one or more sensing devices at the other of the charging base or the electric vehicle. The sensing system may be either integrated into the electric vehicle receiving unit or built into the charging base, depending on which of the charging base or the electric vehicle receiving unit is generating the positioning magnetic field. In some embodiments, the sensor system may not be integrated into the electric vehicle receiving unit or the charging base, and instead be a separate component of the electric vehicle or the charging base dedicated to positioning.

In some embodiments, the frequency of the positioning magnetic field may be identical to the operating frequency of the IPT system, while in some embodiments the frequency of the positioning magnetic field may be different from the IPT system frequency. In certain embodiments, the frequency of the position magnetic field may be slightly offset from the frequency of the IPT system. Regardless of whether the frequency of the positioning magnetic field is identical to the frequency of the IPT system, the frequency of the positioning magnetic field is preferably in the so-called near-field range. However, the frequency of the positioning magnetic field is not required to be in the near-field range. In some embodiments, the frequency for the positioning magnetic field may be in the low frequency (LF) band (e.g. in the range from 120-140 kHz), while in some embodiments, a suitable frequency may be in the high frequency (HF) band (e.g. in the 6.78 MHz or 13.56 MHz ISM-band).

The near-field property of the positioning magnetic field and the characteristics of a magnetic vector field pattern may be useful in determining an accurate position of an object in many use cases. Furthermore, the use of a positioning magnetic field and magnetic vector field patterns to determine an accurate position is relatively insensitive to environmental effects.

As discussed briefly above, in some embodiments, the coil or the circuitry that is normally associated with and used for inductive power transfer (IPT) may generate the position magnetic field (i.e., magnetic sense field). However, in some embodiments, greater accuracy and wider applicability may be attained by using one or more separate coils or circuits specifically for purposes of positioning and separate from the IPT circuitry. Accordingly, in some embodiments, the IPT components and the positioning components may be separate components but may be integrated into a single unit or structure. However, in some embodiments, the IPT components and the positioning components may be separated into individual units or structures.

In some embodiments, the positioning magnetic field may be generated by the base unit and an alignment score (representative of the coupling strength between the receiver and the transmitter) may be determined by measuring, for example, the vehicle coil's short-circuit current or open-circuit voltage, among other methods. The current level required at the transmitter of the positioning magnetic field may be less than that required during IPT.

In some embodiments, a magnetic field sensing system may provide position information over an extended range, which may be used to assist the driver of the electric vehicle to accurately park the electric vehicle on the sweet spot. Such embodiments may require dedicated sensing devices that are frequency selective and considerably more sensitive than the components used in an IPT system. Furthermore, such a system may be capable of operating at lower magnetic field levels compliant with human exposure standards in all situations.

These magnetic field sensing systems may also be capable of providing higher positioning accuracy and wider applicability by using one or more dedicated coils for generating the magnetic field. The generator coils may be arranged and configured for generating a more complex magnetic field pattern than the magnetic fields of the IPT system. In some embodiments, the methods and systems described herein may be used in various other embodiments of wireless power transfer or IPT, for example, dynamic vehicle charging on a roadway, or driverless navigation or general positioning and automated control technique (e.g., robotic controls, etc.). Sensing the generator coils by the magnetic field sensing system configured to operate in the near field may apply for assisting with parking in a parking stall or parking in an extended parking area, for example, inside a car park, a parking garage, or a parking lot. In such locations, the magnetic field sources may be roadway-embedded, for example, embedded in the access aisles or the shoulders of the drivable roadways.

A system for determining a positional relationship and orientation between the electric vehicle IPT coupler and the charging base IPT coupler may use either a ground-based coordinate system (x', y', z'), where the origin is at the magnetic center of the charging base IPT coupler, or a vehicle-based coordinate system (x, y, z), where the origin of the coordinate system is at the magnetic center of the electric vehicle IPT coupler, as will be further described below. For defining a parking position in some embodiments, a two-dimensional coordinate system (x',y') or (x,y), respectively, may suffice.

In some embodiments, the magnetic center point of an IPT coupler may be defined as the point in the horizontal plane where the two vertical symmetry planes of the magnetic field pattern as generated by that IPT coupler intercept. This definition may apply to both the charging base IPT coupler and the electric vehicle IPT coupler, provided that the magnetic field pattern that would be ideally generated by each of the IPT couplers exhibit two vertical symmetry planes.

Figure 4B:
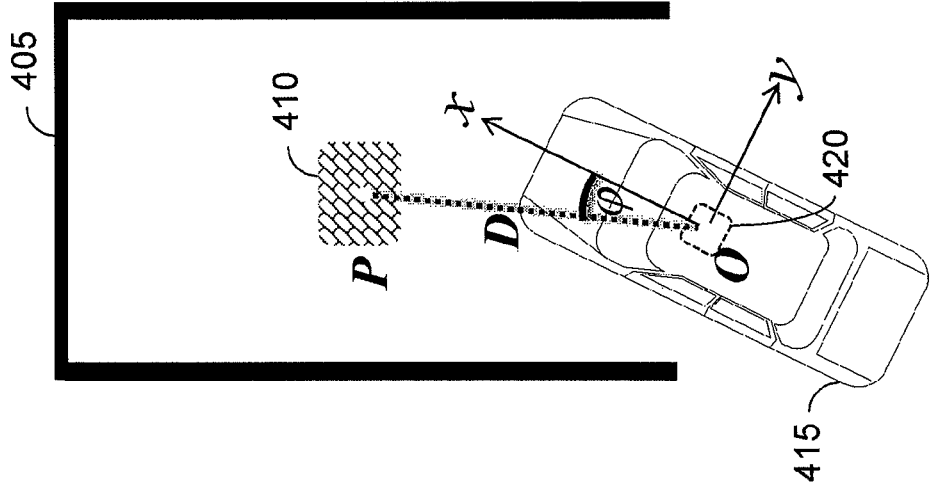
FIG. 4B illustrates a second defined positional relationship between the electric vehicle and the parking stall using an exemplary coordinate system with its origin in the electric vehicle in accordance with an exemplary embodiment.
Figure 4A:
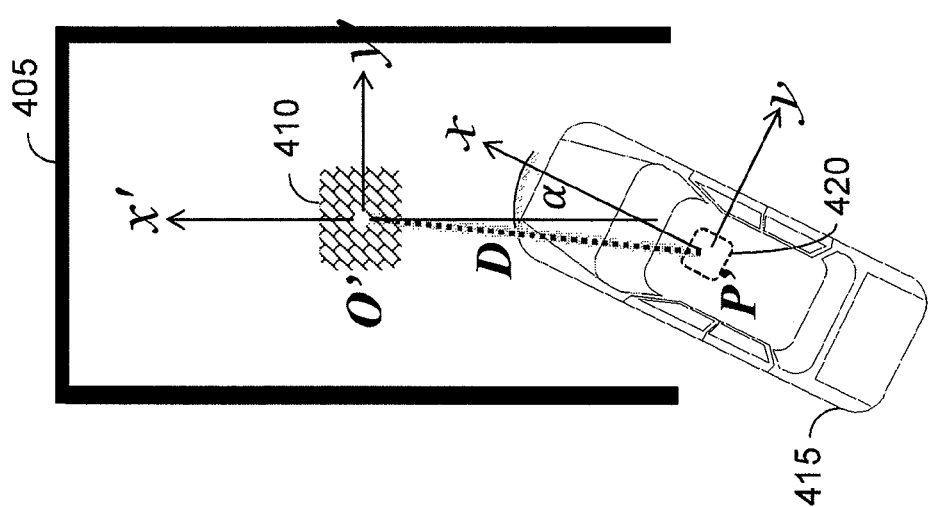
FIG. 4A illustrates a first defined positional relationship between the electric vehicle and a charging spot installed in a parking stall using an exemplary coordinate system with its origin in the parking stall in accordance with an exemplary embodiment.

FIG. 4A illustrates a first defined positional relationship between the electric vehicle and a charging base installed in a parking stall using an exemplary coordinate system with axis x' and y' aligned with the parking stall and with its origin O' in the magnetic center of the charging base. The x'-axis is parallel to the longitudinal (longer) axis of the parking stall, and the y'-axis is perpendicular to the x'-axis. The z'-axis (not shown) is perpendicular to the (x', y')-plane. The first defined positional relationship may be described in the ground-based coordinate system (x', y') of the parking stall by the position P' of the magnetic center of a vehicle IPT coupler 420 and an angle of rotation α of the vehicle's coordinate system (x,y) relative to the coordinate system of the parking stall. The distance between points O' and P' is denoted by D. Point P' is also shown as being the origin of a vehicle-based coordinate system (referred to as Point O in reference to the vehicle-based coordinate system) with the x-axis being parallel to the longitudinal axis of the electric vehicle 415 and the y-axis being in the direction perpendicular to the longitudinal axis of the electric vehicle 415. An angle α is shown as being the angle of rotation from the vehicle-based coordinate system to the ground-based coordinate system.

The parking stall 405 comprises markings depicting an example of the outer limits of the parking stall or the parking spot where a vehicle may ordinarily be parked. The charging base IPT coupler 410 is shown as being substantially at the center of the parking stall 405, while the electric vehicle IPT coupler 420 is shown as being substantially at the center of the electric vehicle 415. The charging base IPT coupler 410 and the electric vehicle IPT coupler 420 are located such that when the electric vehicle 415 is parked appropriately within the parking stall 405 (i.e., the electric vehicle 415 is parked substantially at the center of the parking stall 405), the electric vehicle IPT coupler 420 is located substantially above the charging base IPT coupler 410. When the electric vehicle IPT coupler 420 is located substantially above the charging base IPT coupler 410, the two IPT couplers 410 and 420 may be described as being substantially aligned. The alignment of the two IPT couplers 410, 420 may be numerically defined by a coupling factor, wherein the coupling factor increases as the two IPT couplers 410, 420 are more aligned and decreases as they are less aligned. In some embodiments, the charging base IPT coupler 410 may be located anywhere within the parking stall 405 such that when the electric vehicle 415 is parked within the parking stall 405, the charging base IPT coupler 410 and the electric vehicle IPT coupler 420 are substantially aligned.

In some embodiments, the charging base IPT coupler 410 may serve as a transmitter of wireless power via a generated wireless power field, and the electric vehicle IPT coupler 420 may serve as a receiver of wireless power via the wireless power field. When the electric vehicle 415 parks within the parking stall 405 such that the electric vehicle 415 is substantially centered within the parking stall 405 and/or the charging base IPT coupler 410 and the electric vehicle IPT coupler 420 are substantially aligned, the charging base IPT coupler 410 may transmit wireless power to the electric vehicle IPT coupler 420 via the wireless power field. As the coupling factor between the charging base IPT coupler 410 and the electric vehicle IPT coupler 420 increases (i.e., the two IPT couplers 410, 420 become more substantially aligned), the efficiency of wireless power transfer between the two IPT couplers 410 and 420 increases. As the coupling factor decreases, the efficiency of the wireless power transfer likewise decreases.

FIG. 4B illustrates a second defined positional relationship between the electric vehicle and the charging base using an exemplary coordinate system with an x-axis and a y-axis and with its origin in the magnetic center point of the electric vehicle IPT coupler. As opposed to the first defined positional relationship described above in reference to FIG. 4A, the second defined positional relationship does not include the orientation (angle of rotation) of the electric vehicle 415. Such a second defined positional relationship may be solely described in the vehicle-based coordinate system and may not need the ground-based coordinate system (x', y'). In some embodiments, a position of the charging base IPT coupler 410 may be described by the position P of the charging base IPT coupler 410 as 'seen' by or relative to the electric vehicle 415 in the vehicle-based coordinate system in terms of Cartesian coordinates (xp, yp) or in terms of polar coordinates (distance D and angle $\phi$).

In some embodiments, the second defined positional relationship may suffice. For example, there may be no need for determining the skew angle $\alpha$ of the electric vehicle 415 relative to the parking stall 405. Instead, the driver of the electric vehicle 415 may care about a correct orientation of the electric vehicle 415 so that the electric vehicle 415 is parked substantially parallel to the parking stall 405 markings as indicated in FIG. 4A. If no markings are visible (for example, due to snow), a driver may orient the electric vehicle 415 using other visible objects and structures, such as other parked vehicles, curbs, grass verges, wheel stoppers, walls, etc. to align the electric vehicle 415 substantially parallel to the parking stall 405. In parking lots where parking stalls 405 are angled (e.g. 45°), this may be more challenging.

As opposed to the first defined positioning requiring at least three position values (xp', yp', $\alpha$), at least two position values (D, $\phi$) may be determined for the second defined 2D positioning, simplifying the problem and potentially reducing complexity and cost. A positioning method based on sensing the magnetic field may directly provide the distance D (for example, by sensing the field magnitude (level)) and the angle $\phi$ (for example, by using direction finding techniques).

For fully automatic vehicle parking with no or little driver intervention requiring higher reliability and safety, the guidance and alignment system may significantly benefit from or may necessitate enhanced position data, depending on the system implementation.

Determining a positional relationship between the charging base IPT coupler 410 and the electric vehicle IPT coupler 420 in a suitable coordinate system (e.g., one of the ground-based and vehicle-based coordinate systems described above) based on magnetic field vectoring may involve the generating and sensing of a positioning magnetic field. In some embodiments, the positioning magnetic field sensed may be the magnetic field used for IPT between the charging base IPT coupler 410 and the electric vehicle IPT coupler 420. In some embodiments, the positioning magnetic field sensed may be a magnetic field generated purely for purposes of determining a position (i.e., a positioning magnetic field). In magnetic field vectoring, a system of sensors and signal detectors providing at least two outputs may sense the positioning magnetic field. Magnetic field vectoring in two dimensions may use at least two outputs, while at least three outputs may be used for three-dimensional magnetic field vectoring. The outputs may be considered as components of the magnetic field vector and may be obtained by sensing the positioning magnetic field via a plurality of sense coils (or other sensors sensitive to magnetic fields) and generating outputs via a plurality of signal detectors, each of the signal detectors providing as its output at least an amplitude (e.g., a signal level, a voltage level, a current level) information denoted by vector (Vx, Vy, Vz).

In some embodiments, a three-dimensional vector (Vx, Vy, Vz) may be obtained from an orthogonal system of sensors. A sensor system may be orthogonal if there exists a first distinct field direction (or angle of rotation of the sensor system relative to the direction of the field) where Vy and Vz vanish, a second distinct field direction where Vx and Vz vanish, and a third distinct field direction where Vx and Vy vanish, in embodiments where the sensing system is subjected to a uniform magnetic field (i.e., a magnetic field with parallel field lines) that expands over a sufficiently large space, and that the first, the second and the third field directions are pairwise perpendicular (orthogonal). In some embodiments, the field directions may be substantially orthogonal, wherein the three directions are not exactly pairwise orthogonal but may deviate within a range of the 90 degrees orthogonal angle. In some embodiments, this range may be +/−10 degrees, while in some embodiments the range may be +/−20 degrees.

In some embodiments disclosed herein, the charging base may generate the positioning magnetic field signal, and the positioning magnetic field sensing is performed by the electric vehicle receiving system. However, as discussed briefly above, the positioning magnetic field may be generated by either the charging base or by a unit aboard the electric vehicle. The embodiments disclosed herein disclose the ability to integrate the coils and/or circuitry for generating and sensing the positioning magnetic field signal into the charging base IPT coupler 410 and into the electric vehicle IPT coupler 420. In some embodiments, the principles and methods disclosed herein may also apply to generating the positioning magnetic field signal at the electric vehicle IPT coupler 420 and sensing the positioning magnetic field at the charging base IPT coupler 410. Additionally, in some embodiments the position magnetic field sensing and generating components may not be integrated into the IPT structures 410 and 420 and may be discrete structures.

Sensing the magnetic field may be accomplished in a variety of ways. For example, in some embodiments, an arrangement of orthogonal sense coils may each be positioned in a different plane, the planes being pairwise perpendicular (orthogonal). In some embodiments disclosed herein, the method and apparatus use a plurality of at least three planar sense coils of electrically conductive material positioned substantially co-planar and disposed on a planar substrate of magnetically permeable material (e.g., a ferromagnetic material or a ferrite material). Moreover, some embodiments disclosed herein may include a signal combiner configured to linearly combine outputs U1, U2, U3 of the at least three sense coil in a manner to provide at least vector (Vx, Vy, Vz) at an output of the detector.

FIG. 5A depicts a schematic view of a sensor and detector system having the sense coils disposed on a substrate with a signal combiner and detector having three outputs, generally referred to as sensing system 500A. FIG. 5A depicts a plurality of three sense coils 510A-510C being substantially co-planar and disposed on a substrate 505 comprising a magnetically permeable substrate, for example a ferromagnetic material. FIG. 5A also depicts each of the three sense coils 510A-510C connected to an input of a signal combiner and detector 520 via wiring 515A-515C. The signal combiner and detector 520 is shown having three outputs 525A-525C; in some embodiments, the outputs 525 may be fed into a guidance or alignment circuit or system (not shown). In some embodiments, each of the outputs 525A, 525B, and 525C may comprise a vector component that can be used for determining a position or direction of the vehicle IPT coupler relative to the base IPT coupler in a suitable coordinate system.

In some embodiments, more than three sense coils 510 may be used for positioning purposes (see FIGS. 6A-6D). In some embodiments, the plurality of sense coils 510 may be disposed equidistantly and in a manner such that each sense coil 510 is spaced the same distance away from each of the other sense coils 510. For example, in FIG. 5A, sense coils 510A-510C are disposed on the corners of an equilateral triangle 511. In some embodiments, the sense coils 510 are positioned close to the edges and corners of the magnetically permeable substrate (not shown). This may provide largest induced voltages thus maximum sensitivity. In some embodiments, the plurality of sense coils 510 may be disposed in a manner such that the plurality of sense coils 510 is symmetric along at least one axis. In some embodiments, the plurality of sense coils 510 may be pairwise disjoint (i.e., non-overlapping) as shown in FIG. 5A, or they may be partially overlapping. If the sense coils 510 are overlapping, mutual coupling between the various combinations of sense coils 510 may be avoided by dimensioning and positioning the sense coils 510 in a specific manner.

The manner of dimensioning and positioning of the sense coils 510 may be a quasi-zero coupling arrangement. A quasi-zero coupling arrangement may be advantageous in an alignment and guidance system where the sense coils 510 are tuned based on resonance (e.g., by using a parallel capacitor). Resonance tuning may assist in increasing sensitivity of the sense coils 510 and of the guidance and alignment system. Quasi-zero coupling serves to reduce or minimize mutual inductance and thus mistuning effects as they may occur depending on the relative directions of the induced currents.

The sense coils 510 may comprise any of a variety of shapes, for example, a circle, a square, a rectangle, a triangle, etc. Similarly, the shape of the substrate 505 may be rectangular, triangular, circular, or any other shape preferably providing at least one axis of symmetry along which the plurality of sense coils 510 may be disposed. In some embodiments, there may be an electrically conductive element (e.g., an aluminum plate not shown) disposed on the opposite side of the substrate 505 from the sense coils 510 to reduce the influence and impact of the environment on the sensing capabilities and characteristics of the sense coils 510 and signal combiner and detector 520. The electrically conductive element may also help reduce unpredictable effects of a metallic environment and shield the sense coils 510 from electromagnetic interference. Such a back plate or shield may be required if the sensing system 500A comprising the plurality of planar sensor coils 510 is installed on the bottom of an electric vehicle or on a ferroconcrete ground.

The sense coils 510 may receive the positioning magnetic field being transmitted by one of the charging base or the electric vehicle, depending on which is acting as the transmitter and which is the receiver. If the sense coils 510 are mounted on the electric vehicle, then the charging base is the transmitter; if the sense coils 510 are mounted on the charging base, then the electric vehicle is the transmitter. Each of the sense coils 510A-510C may receive the positioning magnetic field and generate a voltage induced by the received magnetic field. The voltage from each of the sense coils 510A-510C may then be provided to the signal combiner and detector 520 via wiring 515A-515C.

The signal combiner and detector 520 may receive the voltage outputs of the sense coils 510 and may linearly combine the outputs of the at least three sense coils 510A, 510B, and 510C in a manner to provide at least outputs 525A, 525B, and 525C comprising vector components Vx, Vy, Vz as the outputs of the detector 520.

Accordingly, the components of the sensing system 500A shown in FIG. 5A receive a wireless positioning magnetic field and, after generating a plurality of signals in response to the positioning magnetic field, output a plurality of vectors that can be used for determining the position or the direction of the vehicle IPT coupler relative to the base IPT coupler in a suitable coordinate system.

A system according to another exemplary embodiment of the invention is depicted in FIG. 5B and referred to as sensing system 500B. Certain functions and purposes of the components of the sensing system 500B are similar as those described with regard to FIG. 5A above. However, the signal combiner and detector 520' of FIG. 5B may provide a single serial output 525'. Thus, the signal combiner and detector 520' of FIG. 5B may be controllable with the combiner control input 521 to adjust or select the desired component of the magnetic field. Sensing of at least a first component and a second component (e.g. Vx and Vy) of the magnetic field may be performed time-sequentially by changing parameters of the signal combiner and detector 520'.

The vector components at single serial output 525' can be used for determining the position or direction of the vehicle IPT coupler relative to the base IPT coupler in a suitable coordinate system.

FIG. 6A depicts a schematic view of a sensor and detector system having the sense coils disposed on a substrate with a signal combiner and detector having three outputs, generally referred to as sensing system 600A. The sensor and detector system 600A of FIG. 6A comprises four sensor coils 610A-610D disposed on a substrate 605 comprising a magnetically permeable material, for example a ferromagnetic material. The substrate 605 is rectangular, with one of each of the sense coils 610A-610D disposed near the corners of the substrate 605, i.e., on the corners of a second, smaller rectangle 611. The substrate 605 may have a longitudinal dimension and a latitudinal direction that is perpendicular to the longitudinal direction. The longitudinal dimension may refer to the longest dimension of the substrate 605. The pair of sense coils 610A and 610B is positioned symmetrically with respect to the pair of sense coils 610C and 610D about the center of the substrate 605 in the longitudinal (longer) axis of the substrate 605. Similarly, the pair of sense coils 610A and 610C is positioned symmetrically with respect to the pair of sense coils 610B and 610D about the center of the substrate 605 in an axis perpendicular to the longitudinal axis. In FIG. 6A, each of the sense coils 610A-610D are connected to the signal combiner and detector 620 via wiring 615A-615D, respectively. The signal combiner and detector 620 is shown having three outputs 625A, 625B, and 625C; in some embodiments, these outputs 625 may be fed into a guidance or alignment circuit or system for determining a position or direction of the vehicle IPT coupler relative to the base IPT coupler in a suitable coordinate system.

FIG. 6B depicts a schematic view of a sensor and detector system having the sense coils disposed on a substrate. FIG. 6B comprises four sensor coils 610A-610D disposed on a substrate 605 comprising a magnetically permeable material, for example a ferromagnetic material. The substrate 605 is rectangular, with one of each of the sense coils 610A-610D disposed on the corners of a diamond 613. The pair of sense coils 610A and 610D and pair of sense coils 610B and 610C are disposed such that sense coils 610A and 610D are symmetric about the latitudinal symmetry axis of substrate 605. Similarly, the pair of sense coils 610B and 610C is disposed such that they are symmetric about the longitudinal symmetry axis of substrate 605. In some embodiments, sense coils 610 are positioned close to the edges of the magnetically permeable substrate. This may provide largest induced voltages, thus maximum sensitivity.

FIG. 6C is a schematic view of a magnetic field sensing system 600A as integrated into an IPT coupler. As shown in FIG. 6C, sense coils 610 may be formed in a PCB, the PCB disposed on a substrate 605, the substrate 605 disposed on a conductive back plate 616 with an IPT coil 612 disposed on the PCB opposite the substrate 605. FIG. 6C depicts a top plan view of a sensor and detector system having the sense coils 610A-610D disposed on a substrate 605 within a printed circuit board (PCB), the substrate 605 having a conductive back plate 616 on the side of the substrate 605 opposite the sense coil PCB (not shown), and an IPT coil 612 on the other side of the sense coil PCB opposite the substrate 605. The plurality of four sense coils 610A-610D being substantially co-planar may be constructed on a printed circuit board (PCB) and disposed on a substrate 605 comprising a magnetically permeable substrate, for example a ferromagnetic material. The substrate 605 is rectangular, with one of each of the sense coils 610A-610D disposed near the corners of the substrate 605, i.e., on the corners of a second, smaller rectangle (not shown). The substrate 605 may have a longitudinal dimension that refers to the longest dimension of the substrate 605 and a latitudinal direction that is perpendicular to the longitudinal direction. The pair of sense coils 610A and 610B is positioned symmetrically with respect to the pair of sense coils 610C and 610D about the center of the substrate 605 in the longitudinal (longer) axis of the substrate 605. Similarly, the pair of sense coils 610A and 610C is positioned symmetrically with respect to the pair of sense coils 610B and 610D about the center of the substrate 605 in an axis perpendicular to the longitudinal axis. In some embodiments, the conductive back plate 616 may also be rectangular and may be larger than the substrate 605. In other embodiments, the conductive back plate 616 may be of any other shape and size. In FIG. 6C, each of the sense coils 610A-610D are shown having wiring 615A-615D connected to the respective sense coil 610 and lead out of the figure, presumably to a signal combiner and detector (not shown).

The IPT coil 612 is shown having an essentially rectangular shape that is smaller than the rectangular shape of the substrate 605 according to an engineering practice for a so-called "Circular"-type IPT coupler. Each of the sense coils 610A-610D may be shown substantially above the corners of the rectangular IPT coil 612. The planar sense coils 610 may be implemented in a "structure," the structure here comprising a PCB with thin copper traces fully embedded within the epoxy substrate of the PCB. Embedding the sense coils 610 within the PCB may provide insulation and mechanical protection for the sense coils 610.

The IPT coil 612 may be used to perform inductive power transfer between the charging base and the electric vehicle (not shown). The integrated structure of the IPT coil 612 with the sense coil "structure" may provide embodiments where the IPT coil 612 and the sense coils 610 are located in substantially the same position.

For magnetic vector sensing, quality factor is less important than in IPT couplers. Accordingly, the sense coils 610 may be designed to utilize substantially thin conductors, allowing the sense coils 610 to be fitted into a thin intermediate layer. For example, the sense coils 610 may be designed to be of only 1 mm height so as to avoid noticeably increasing volume or height of the IPT coupler. In some embodiments, the sense coils 610 may connect to a high impedance input preamplifier, as discussed in more detail below. When the sense coils 610 are connected to the high impedance input preamplifier, the amplifier may eliminate any substantial current flow, and thus minimize losses in the sense coils 610 when the IPT coupler is actively transferring power and the sensing coil system is positioned within a strong IPT field. Additionally, current losses due to eddy currents induced in the windings of the sense coils 610 windings may be considered marginal.

In some embodiments, the integrated elements (the IPT coil 612 integrated with the sense coils 610 and substrate 605) shown here may generally apply to various types of planar IPT couplers that comprise a magnetically permeable material, including "multi-coil" couplers and "Solenoid"-type couplers. The IPT coil 612 shown may comprise a magnetically permeable material, for example a monolithic ferrite block serving as a magnetically permeable core of the IPT coil 612, or may be composed of multiple magnetically permeable segments or portions (e.g., plates, rods, blocks, tiles). If composed of multiple magnetically permeable portions, the portions may be at least partially spaced such that they form a structure of parallel portions or a grid structure. If the IPT coil 612 exhibits an anisotropic effective permeability, the sensitivity of the sense coils 610 where the effective permeability is lower may be reduced. Differences in the effective permeability may be compensated for (calibrated to accommodate) in the signal combiner and detector 620 by selecting corresponding coefficients, as will be discussed below.

If the sense coils 610 are integrated into the structure or assembly of an IPT coupler, different synergies may be used. For example, an IPT coupler for low frequency resonant induction may consist of a Litz wire coil structure disposed on a magnetically permeable material, where the substrate 605 may serve as the magnetically permeable material (e.g. a ferrite material) and of a conductive back plate 616 on the rear side of the magnetically permeable material. Sense coils 610 of the magnetic field sensor may be disposed on the substrate 605 in areas not covered by the IPT coil structure, for example in coil openings, but they may also be accommodated in a thin layer between the Litz wire coil and the substrate 605. This separation layer may provide insulation and mechanically protect the vulnerable Litz wire (for example, from ferrite splints that may break off a ferrite structure when under mechanical stress).

FIG. 6D is a cross-section profile view of the magnetic field sensing system 600A showing sense coils formed in a PCB, the PCB disposed on a substrate, the substrate disposed on a back plate, having an IPT coil disposed on the PCB opposite the substrate, the substrate also serving as the magnetically permeable material of the IPT coupler. The elements of FIG. 6D may not be necessarily drawn to scale but are illustrated for ease of depiction and description. FIG. 6D depicts a profile view of a schematic for a sensing system 600A having the sense coils 610 within a printed circuit board (PCB) disposed on a substrate 605, the substrate 605 having a conductive back plate 616 on the side of the substrate 605 opposite the sense coil PCB 621, and an IPT coil 612 disposed on the side of the sense coil PCB 621 opposite the substrate 605. FIG. 6D more clearly shows how the individual components described in FIG. 6C are laid out. At the top of FIG. 6D, the conductive back plate 616 is shown. The conductive back plate 616 is shown as having a rectangular profile or cross-section, and is shown to be thinner than the substrate 605 but wider than the substrate 605. The conductive back plate 616 is attached to the substrate 605 on the lower edge of the conductive back plate 616. The substrate 605 is shown coupled to the conductive back plate 616 on its top edge and the sense coil PCB 621 on its lower edge. The substrate 605 is shown being thicker than the conductive back plate 616 and the sense coil PCB 621, and is shown being shorter than the conductive back plate 616 but approximately the same length as the sense coil PCB 621. The sense coil PCB 621 is shown having the IPT coil 612 mounted on its lower edge. The cross-section shown shows the IPT coil 612 being composed of a plurality of parallel structures. FIG. 6D shows each edge of the IPT coil 612 having five parallel structures, but one of skill in the art would understand that the IPT coil 612 may comprise more or fewer parallel structures or similar structure.

The systems shown in each of FIGS. 5A-6D may sense the positioning magnetic field using the depicted plurality of sense coils 510 or 610, may linearly combine the outputs of the plurality of sense coils 510, 610 via the signal combiners and detectors 520, 520', 620 and may use the combined and detected signals at the output of the combiners and detectors 520, 520', 620 to provide vector output 525, 525', 625, either as a single serial (time-sequential) vector output 525' or with a multiple parallel output 525A, 525B, and 525C, 625A, 625B, 625C representing vector components Vx, Vy, Vz. The signal combiners and detectors 520, 520', 620 may linearly combine the outputs of the sense coils 510, 610 as received via wiring 515, 615 at the inputs of the signal combiners and detectors 520, 520', 620. In some embodiments, the linear combination methods utilized by the signal combiners and detectors 520, 520', 620 may be expressed as a system of equations or in a matrix representation, for example:

$$\begin{bmatrix} v_x \\ v_y \\ v_z \end{bmatrix} = \begin{bmatrix} c_{11} & c_{12} & \cdots & c_{1N} \\ c_{21} & c_{22} & \cdots & c_{2N} \\ c_{31} & c_{32} & & c_{3N} \end{bmatrix} \cdot \begin{bmatrix} U_1 \\ U_2 \\ \vdots \\ U_N \end{bmatrix}, \quad \text{(Equation 1)}$$

where components of vector $\vec{U}$ and vector $\vec{v}$ denote the combiner input and output signals, respectively, and where $c_{ij}$ denote the coefficients of the combiner matrix. The number N of input components may be determined by the number of sense coils 510, 610 utilized in the sensing system. In some embodiments, the vectors $\vec{U}$ and $\vec{v}$ may be expressed as voltage-time functions, or complex phasors, etc. The detector of the signal combiners and detectors 520, 520', 620 may perform a non-linear operation on components of signal vector $\vec{v}$, for example detecting an amplitude, a signal level, or a magnitude of a complex phasor to obtain output vector $\vec{V}$. The signal combiners and detectors 520, 520', 620 may also perform operations such as filtering, averaging, correlating, etc., of the linearly combined signals of the signal combiner or of the outputs of the sense coils 510, 610.

In systems as depicted in FIGS. 5A-5B, the number of inputs and outputs of the combiner of the signal combiners and detectors 520, 520' may be equal (e.g. N=3) and outputs proportional to the combiner inputs, meaning that non-diagonal coefficients of the combiner matrix are zero, represented as $$\begin{bmatrix} v_x \\ v_y \\ v_z \end{bmatrix} = \begin{bmatrix} c_{11} & 0 & 0 \\ 0 & c_{22} & 0 \\ 0 & 0 & c_{33} \end{bmatrix} \cdot \begin{bmatrix} U_1 \\ U_2 \\ U_3 \end{bmatrix}. \quad \text{(Equation 2)}$$

The sense coil structures of FIGS. 6A and 6C (i.e., the sense coils 610 disposed in a quadruple coil structure in a rectangular layout on the substrate 605) are linearly combined and detected by the signal combiner and detector 620 to provide vector output Vx, Vy, Vz. In some embodiments (for example, the one shown in FIG. 6A), the vector output after signal combining vx, vy, vz may be obtained using the following linear combination method, $$\begin{bmatrix} v_x \\ v_y \\ v_z \end{bmatrix} = \begin{bmatrix} c_1 & -c_1 & c_1 & -c_1 \\ c_2 & c_2 & -c_2 & -c_2 \\ c_3 & c_3 & c_3 & c_3 \end{bmatrix} \cdot \begin{bmatrix} U_1 \\ U_2 \\ U_3 \\ U_4 \end{bmatrix}, \quad \text{(Equation 3)}$$

where the coefficients c1, c2, c3 denote scaling factors that may be different from each other and obtained in a process of calibrating the field sensor. The three detector outputs Vx, Vy, Vz may be interpreted as the x-, y-, and z-components of the magnetic field, in embodiments where the sensor system is subjected to a uniform field (i.e., a magnetic field with parallel field/flux lines) expanding over a sufficiently large space and where the common plane of the sense coils 610 is oriented in parallel to the (x, y)-plane of the coordinate system.

In FIG. 6B, the four sense coils 610 are disposed in a diamond 613 on the substrate 605. A substantially orthogonal sensor system may be obtained with the following linear combination $$\begin{bmatrix} v_x \\ v_y \\ v_z \end{bmatrix} = \begin{bmatrix} 0 & 0 & c_1 & -c_1 \\ c_2 & -c_2 & 0 & 0 \\ c_3 & c_3 & c_3 & c_3 \end{bmatrix} \cdot \begin{bmatrix} U_1 \\ U_2 \\ U_3 \\ U_4 \end{bmatrix}. \quad \text{(Equation 4)}$$

FIG. 7A and FIG. 7B illustrate the effect of the magnetically permeable substrate on the magnetic field and the principle of the planar multi-coil sensor of the sensing systems as depicted in FIGS. 5A to 6A. The magnetic field is visualized by lines of magnetic flux in FIG. 7A for a field direction that is substantially perpendicular and in FIG. 7B for a field direction that is substantially parallel to the plane of the sense coils 610. For the sake of simplicity and to ease illustration, only two sense coils 610A and 610B are shown disposed on the surface of the substrate 605. Moreover, the sense coils 610A and 610B may be configured and coupled to the combiner and detector (not shown) so that induced voltage signals of the first and second coils 610A and 610B at the combiner input have equal polarity when flux passes through the sense coils 610A and 610B in the same direction. In FIG. 7A, flux is shown passing through the sense coils 610A and 610B in the same direction, whilst in FIG. 7B, flux is passing through the sense coils 610A and 610B in opposite directions.

To sense the magnetic field component that is perpendicular to the plane of the sense coils 610A and 610B as illustrated in FIG. 7A, coil outputs are combined co-phase so that induced voltages are adding up in some embodiments. However, voltages would cancel out for a flux direction in parallel to the coil plane, since the flux is passing through the sense coils 610A and 610B in opposite directions. Conversely, to sense a flux component that is parallel to the coil plane as illustrated in FIG. 7B, outputs of the coil pair are combined anti-phase so that induced voltages are adding up again. However, voltages would cancel out for a perpendicular flux direction, since flux is passing through the sense coils 610A and 610B in the same direction. Those skilled in the art would appreciate that this basic concept of field sensing may remain valid when a conductive back plate (not shown in FIGS. 7A and 7B) was added on the opposite (rear) side of the substrate 605, though the field pattern may substantially change.

Figure 8:
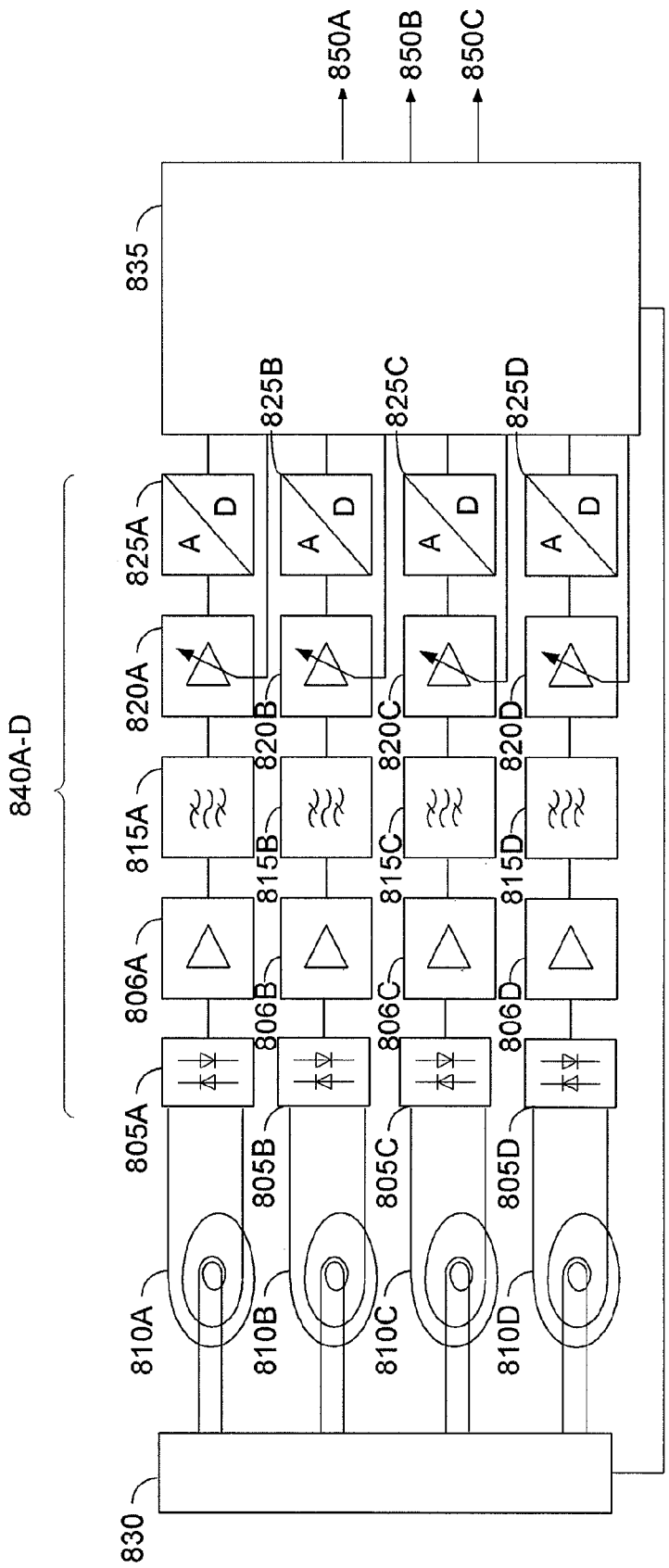
FIG. 8 depicts a block diagram of an embodiment of a magnetic field sensing and detecting system in accordance with an exemplary embodiment having multiple sense coils.

FIG. 8 depicts a block diagram of an embodiment of a magnetic field sensing and detecting system in accordance with an exemplary embodiment having four sense coils. The sensing and detecting system of FIG. 8 comprises the sense coils 810A-810D, each sense coil 810A-810D coupled to a series of components including an input protection circuit 805A-805D, a preamplifier 806A-806D, a filter 815A-815D, a variable gain amplifier 820A-820D, and an analog-to-digital (A/D) converter 825A-825D, with each series of components described above for each sense coils 810A-810D coupled to a digital signal processor 835. The digital signal processor (DSP) 835 is coupled to a local test signal generator 830. The DSP 835 shown outputs three signals, 850A-850C. The input protection circuits 805A-805D, pre-amplifiers 806A-806D, filters 815A-815D, and variable gain amplifiers 820A-820D may comprise the analog-front-end (AFE) channels 840A-840D, while the local test signal generator 830 may comprise part of the means for calibration and self-testing. The three signal outputs 850A-850C of the DSP 835 may comprise vector components Vx, Vy, Vz. DSP 835 may be configured to concurrently process several positioning magnetic field signals generated by the sense coils 810A-810D and deliver vector outputs $V_{x,i}$, $V_{y,i}$, $V_{z,i}$ for each of the i=1 . . . N positioning magnetic field signals. In some embodiments, the positioning magnetic fields received by the sense coils 810A-810D may comprise information or other similar signals. In some embodiments, multiple positioning magnetic field signals may be broadcast by the transmitter in the same frequency band as each other (i.e., at different time slots) and/or at different frequencies. In some embodiments, multiple positioning magnetic field signals or other signals may have to be sensed and processed by a single magnetic field sensing and detection unit simultaneously.

The local test signal generator (LTSG) 830 may be used to calibrate and self-test the magnetic field sensing and detecting system. In some embodiments, the LTSG 830 may locally generate a magnetic field at each sense coil 810 or for a group of sense coils 810. The local magnetic fields of each sense coil 810 may then induce voltages in each of the respective sense coils 810A-810D. In some embodiments, each test coil (not individually labeled) that generates the local magnetic field may be disposed in the space inside of a sense coil 810. In some embodiments, the test coils may have a similar shape and/or size as the sense coils 810. In some embodiments, the test coils may be of different shape and/or size as the sense coils 810. The LTSG 830 may be controllable such that it may be used to generate or mimic signals that may appear identical to the positioning magnetic field signals. The LTSG 830 may also mimic different magnetic fields in different directions for one or more of the sense coils 810, for example by injecting different test coils with currents having different amplitudes/phases. The LTSG 830 may calibrate and check the integrity of sense coils 810 and AFE channels 840A-840D components with respect to their amplitude and phase response by generating a controlled magnetic field(s) and verifying that the resulting output of the DSP 835 matches an expected value based on the generated, controlled magnetic field(s). Thus, the LTSG 830 may be used to correct or eliminate vector errors introduced by the AFE channels 840A-840D, for example errors due to component tolerances, thermal drift, non-perfect filter characteristics, etc., or to detect errors in the calibration of the signal combiner or the DSP 835 or the sense coils 810 themselves. In some embodiments, a calibration and test function performed by the LTSG 830 may be required by standards and may be regularly performed by the DSP 835.

As discussed above, each AFE channel 840A-840D may comprise the input protection circuit 805A-805D, the preamplifier 806A-806D, the filter 815A-815D, and the variable gain amplifier 820A-820D. One of ordinary skill will understand that more or fewer components may be utilized in the AFE channels 840A-840D. The outputs of the sense coils 810 generated in response to the positioning magnetic field may be processed by the AFE channels 840 and then combined and detected in the DSP 835. This may ensure the outputs from the various sense coils 810 are optimally combined and detected to obtain a digital vector output Vx, Vy, Vz. The input protection circuits 805A-805D may serve to protect the preamplifiers 806A-806D from being damaged by exposure to a strong magnetic field, for example an IPT magnetic field as may be experienced during wireless charging operations. The input protection circuits within each AFE channel 840A-840D may limit the input voltage experienced by DSP 835 and may be designed such that there is no substantial current flow when the input protection circuits 805A-805D within each AFE channel 840A-840D are actively limiting. In some embodiments, the input impedance of the input protection circuits 805A-805D within the AFE channels 840A-840D may be sufficiently high (e.g., greater than 100 kΩ), so that the currents in the sense coils 810 are virtually zero and voltages in the sense coils 810 induced due to mutual coupling between the sense coils 810 are negligible.

The preamplifiers 806A-806D may have a gain (e.g. 20 dB), a high impedance input (e.g., greater than 100 kΩ), and a relatively low output impedance (e.g., less than 50 Ohm) for driving the following filter stage. In some embodiments, the preamplifiers 806 may be used to amplify the received magnetic field signal received by the sense coils 810. The filters 815A-815D may clean up the signal fed through the preamplifiers 806 that are received by the sense coils 810. In some embodiments, the filters 815 may be bandpass filters having a passband with a reasonably low ripple and with a sufficient width to cover the full frequency band as it may be specified for magnetic vectoring. In some embodiments, the filters 815 may have sufficient suppression (e.g., greater than 60 dB) of signals received out-of-band, particularly at IPT operating frequencies, for example 85 kHz. The filters 815, in some embodiments, may also act as anti-aliasing filters as necessary for sampling the signal in the analog-to-digital (A/D) converter 825. The variable gain amplifiers 820A-820D may ensure that the A/D converters 825A-825D are always operating in a favorable range over the large dynamic range that is required for magnetic vectoring because of the large received signal level variations e.g., due to the so-called near/far effects. In some embodiments, the variable gain amplifiers 820 may be controlled by the DSP 835 that may provide an automatic gain control function. The A/D converters 825A-825D may be used to convert the analog signals generated by the sense coils 810 in response to the positioning magnetic field to digital signals that may be processed by the DSP 835.

In some embodiments, the combining and detecting of inputs generated by the sense coils 810 and fed through the AFE channels 840A-840D and generation of vector outputs $V_{x,i}$, $V_{y,i}$, $V_{z,i}$ may be performed by a DSP 835. In some embodiments, the DSP 835 may perform additional narrow-band filtering of outputs of the sense coils 810, for example by using a digital filter, a digital filter bank (e.g., a Fast Fourier Transform), or similar techniques. In some embodiments, a suitable filter bandwidth for purposes of magnetic field vectoring may be 50 Hz, 25 Hz, or even 10 Hz. The combining of the outputs of the sense coils 810 may be performed before or after a narrow-band filtering according to a set of equations suitable for a particular sense coil 810 configuration. Accordingly, the set of equations may be different for three sense coil 810 configurations when compared to four sense coil 810 configurations. In some embodiments, the DSP 835 may search for positioning magnetic field signals in a specified frequency band and acquire those signals that exceed a defined signal strength or signal-to-noise ratio threshold.

In some embodiments, the DSP 835 may also validate the outputs of the sense coils 810 (received positioning magnetic field signals) by performing integrity and consistency checks to ensure that signals received and processed by the DSP 835 are accurately and reliably handled by the sensing and detecting system that it is functioning properly and that the vector outputs from the DSP 835 are reliable. The integrity and consistency checks may be the same as discussed above in relation to the LTSG 830 above. If inconsistencies are identified, the DSP 835 may generate an output indicating an error, for example an error flag or bit or a message or indicator light, etc. In some embodiments, the DSP 835 may also output information regarding details of the reliability of the output vectors, including, for example, estimated quality of the output vectors or confidence of vector outputs $V_{x,i}$, $V_{y,i}$, $V_{z,i}$. Additionally, in some embodiments, the DSP 835 may also demodulate data from a modulated output of the sense coil 810 (positioning magnetic field signal), for example an identification code (ID), a synchronization sequence or other data that may be communicated via the positioning magnetic field. In some embodiments, this process may require dedicated filtering by the DSP 835 or other components at a larger bandwidth depending on the modulation (e.g. symbol) rate and additionally, time synchronization.

Figure 9B:
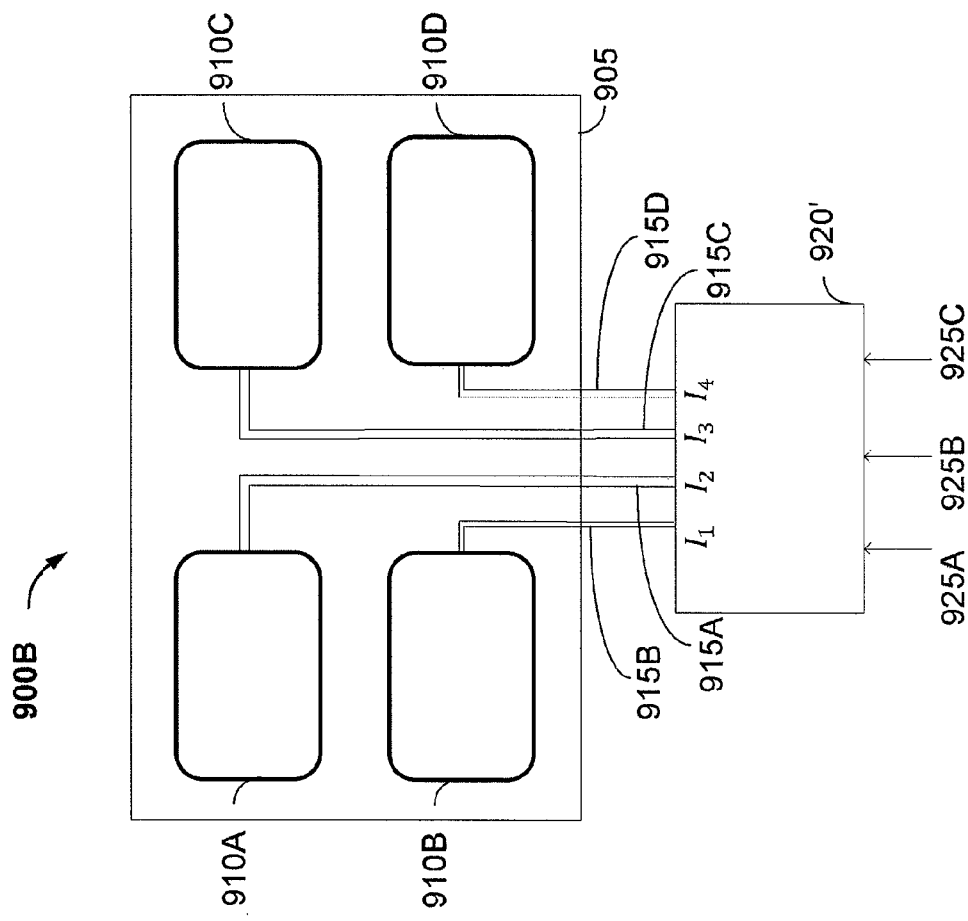
FIG. 9B depicts a schematic view of a multi-coil configuration disposed on a magnetically permeable substrate capable of generating a positioning magnetic field signal from multiple inputs fed into a signal splitter in accordance with an exemplary embodiment.
Figure 9A:
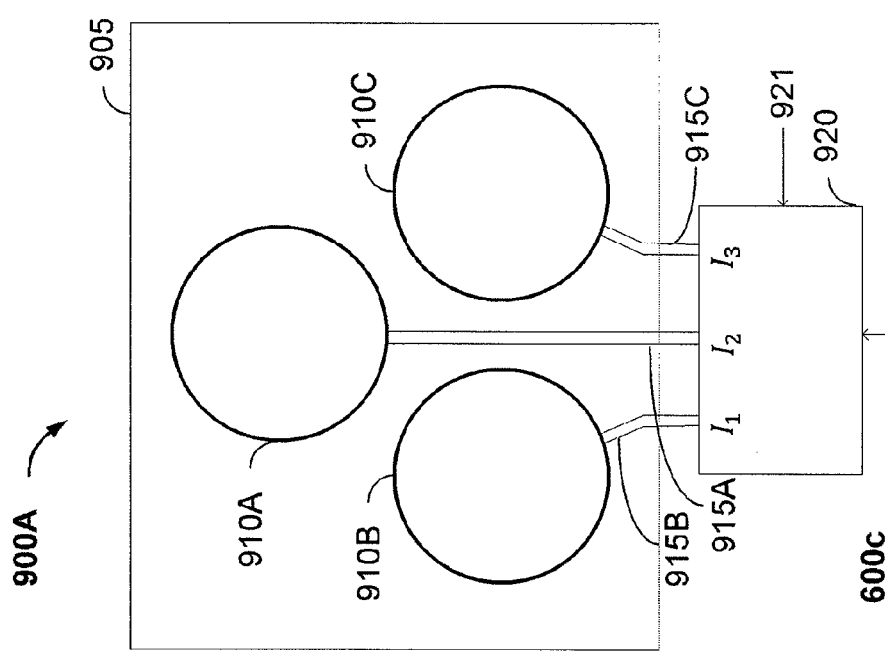
FIG. 9A depicts a schematic view of a multi-coil configuration disposed on a magnetically permeable substrate capable of generating a positioning magnetic field signal from a single input fed into a signal splitter in accordance with an exemplary embodiment.

FIG. 9A depicts a schematic view of a multi-coil configuration of at least three planar coils disposed on a magnetically permeable substrate capable of generating a positioning magnetic field signal and having the ability to generate a magnetic field from a single input fed into a signal splitter, referred to as generating system 900A. The positioning magnetic field generation system of FIG. 9A comprises three generator coils 910A-910C disposed on a substrate 905 comprising a magnetically permeable material, for example a ferromagnetic material. In some embodiments, the generator coils 910A-910C may be similar to the sense coils 510A-510C of FIGS. 5A-6D. FIG. 9A also depicts each of the three generator coils 910A-910C connected to three outputs of a controllable signal splitter 920 via wiring 915. The controllable signal splitter 920 is shown having a single input 925; in some embodiments, the input 925 may be generated by a charging base for the purposes of providing a positioning magnetic field signal for the purpose of guidance or alignment. In some embodiments, the positioning magnetic field signal generated by the generator coils 910 may be received by a sensing system as discussed above in reference to FIGS. 5A-6D. In some embodiments, the signal splitter 920 is configurable by splitter control input 921 to generate a positioning magnetic field with a magnetic moment in one of an x, y, and z direction.

In some embodiments, more than three generator coils 910 may be used for positioning magnetic field generating purposes (see FIG. 9B). In some embodiments, the plurality of generator coils 910 may be disposed equidistantly and in a manner such that each generator coil 910 is spaced the same distance away from each of the other generator coils 910. In some embodiments, the plurality of generator coils 910 may be disposed in a manner such that the plurality of generator coils 910 is symmetric along at least one axis. In some embodiments, the generator coils may be positioned close to the edges and corners of the magnetically permeable substrate (not shown) in order to maximize the generated magnetic moment (level of magnetic field strength). In some embodiments, the plurality of generator coils 910 may be pairwise disjoint (i.e., non-overlapping) as shown in FIG. 9A, or they may be partially overlapping (not shown). If the generator coils 910 are overlapping, mutual coupling between the various combinations of generator coils 910 may be avoided by dimensioning and positioning the generator coils 910 in a specific manner. The manner of dimensioning and positioning of the generator coils 910 may be a quasi-zero coupling arrangement, as described above.

The generator coils 910 may comprise any of a variety of shapes, for example, a circle, a square, a rectangle, a triangle, etc. Similarly, the shape of the substrate 905 may be rectangular, triangular, circular or any other shape preferably providing at least one axis of symmetry along which the plurality of generator coils 910 may be disposed. In some embodiments, there may be an electrically conductive element (e.g., an aluminum plate not shown) disposed on the opposite side of the substrate 905 from the generator coils 910 to reduce the influence and impact of the environment on the generating capabilities and characteristics of the generator coils 910 and help shield the generator coils 910 from interference. Such a back plate or shield may be required if the guidance and alignment system comprising the plurality of planar generator coils 910 is installed on the bottom of an electric vehicle or in a substrate comprising a ferromagnetic material.

The generator coils 910 may generate the positioning magnetic field from one of the charging base or the electric vehicle depending on which is acting as the transmitter and which is the receiver. If the generator coils 910 are mounted on the electric vehicle, then the charging base is the receiver; if the generator coils 910 are mounted on the charging base, then the electric vehicle is the receiver. Each of the generator coils 910 may generate the positioning magnetic field and generate other information signals within the positioning magnetic field. The current used by each of the generator coils 910 may be received from the controllable signal splitter 920 via wiring 915.

The controllable signal splitter 920 may receive an input 925 to output currents to the generator coils 910 from a source (not shown), and may split the input 925 into the components so as to allow the generator coils 910 to generate a positioning magnetic field from which a receiver may determine vectors for positioning. As discussed above with regards to FIGS. 6C and 6D and sense coils 610 being integrated into an IPT coupler, the generator coils 910 may also be integrated into an IPT coupler. Similarly, the generator coils 910 may be implemented within or on a PCB that is inserted, e.g., between IPT coil structure (not shown) and the substrate 905.

The multi-coil configurations depicted in FIGS. 9A and 9B, each composed of at least three planar generator coils 910 disposed on a substrate 905 may be used to generating at least one of a positioning magnetic field with any desired direction (polarization). Regarding generating a positioning magnetic field by a transmitter, the polarization of the generated positioning magnetic field may be best described by the polarization of magnetic moments.

Polarization of the positioning magnetic field may be controlled via manipulating the amplitude and phase of currents that are injected into the generator coils 910. The controllable signal splitter 920 may provide a set of currents to drive the generator coils 910 such that they generate a magnetic field with a desired polarization.

In the multi-coil positioning magnetic field generator shown in FIG. 9A, the controllable signal splitter 920 may comprise a signal splitter with a splitter control input 921. The controllable signal splitter 920 may allow the selection of at least one of the magnetic moments in substantially one of the x-direction, y-direction or z-direction. In the multi-coil positioning magnetic field generator system 900B shown in FIG. 9B, the signal splitter 920' may receive at least two inputs, for example at least two of an x-, y-, and z-direction input for generating a magnetic moment substantially in a x-, y-, and z-direction, respectively. In some embodiments, the directions of the magnetic moments may be substantially orthogonal. Accordingly, if a signal is applied to the x-input but no signal is applied to the y- or the z-inputs, then the multi-coil positioning magnetic field generator may generate a magnetic moment substantially in an x-direction. Similarly, if a signal is applied to the y-input but no signal is applied to the x- or z-inputs, the multi-coil positioning magnetic field generator may generate a magnetic moment substantially in a y-direction, and so forth.

Figure 10:
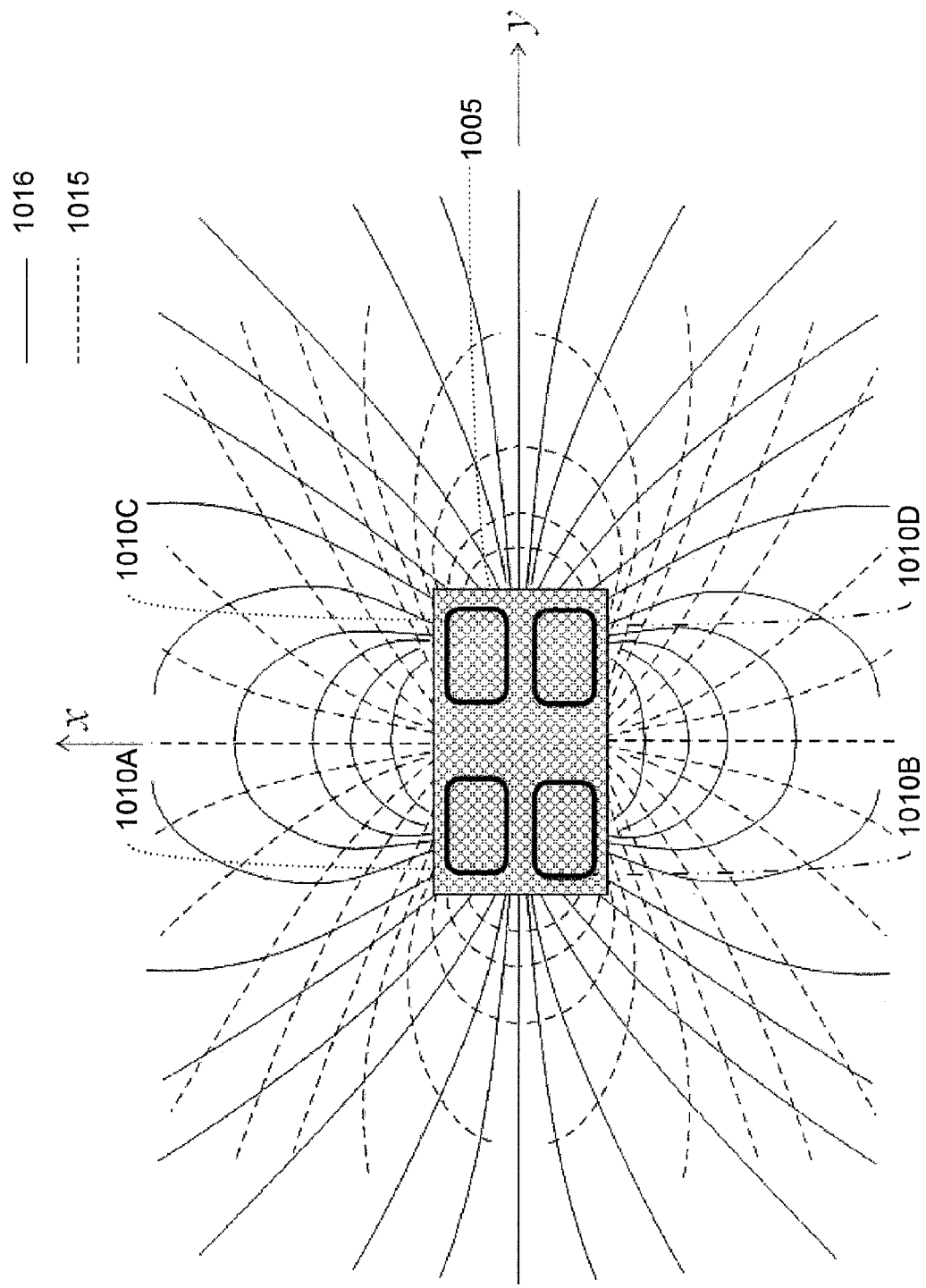
FIG. 10 depicts lines of magnetic flux of magnetic field patterns and a generator coil configuration illustrating concurrent generation of two magnetic fields with different polarization and frequency in accordance with an exemplary embodiment.

FIG. 10 depicts lines of magnetic flux of magnetic field patterns and a generator coil configuration illustrating concurrent generation of two magnetic fields with different polarization and frequency. The lines of magnetic flux depict two magnetic fields being generated with moments in the x-axis and the y-axis, the magnetic fields being generated by the generator coil system with the center of its generator coil arrangement located at the origin of the x-axis and the y-axis. The generator coil system is shown having four generator coils 1010A-1010D mounted on a substrate 1005. FIG. 10 depicts lines of flux of a first field pattern 1015 with a magnetic moment in the x-direction generated at a first frequency $f_x$ and a second field pattern 1016 with a magnetic moment in the y-direction generated at a second frequency $f_y$. Magnetic vectoring based on sensing more than one field with different polarizations (as shown in FIG. 10) has the potential to improve accuracy and reliability of the magnetic field vectoring method in general and may also resolve ambiguity issues. The multi-coil positioning magnetic field generator system of FIG. 10 may receive a vector input $I_x$, $I_y$, $I_z$ (925A-925C) to generate positioning magnetic fields with moments substantially in the x-, y-, and z-directions. If at least two inputs are supplied at the same time and at the same frequency at the vector input, then the generator system may generate at least two fields concurrently, which superimpose and result in a sum field with a magnetic moment that is the vector sum of the at least two moments. However, if the at least two inputs have different frequencies, the generator system of FIG. 10 may generate at least two magnetic fields differing in polarization and frequency. Thus, in some embodiments, a frequency-selective sensing system as shown above in FIG. 8 may be used to sense the at least two fields separately as non-superimposed fields, provided that the two frequencies are sufficiently spaced apart.

In another embodiment, the two generated magnetic fields may have moments in other directions than the x-axis and y-axis, e.g., a field at the first frequency on a x'-axis and the field at the second frequency on an y'-axis, e.g., the two bisecting lines of the x-axis and y-axis.

In yet another embodiment, three magnetic fields with moments in yet other directions may be generated each at a different frequency.

Figure 11:
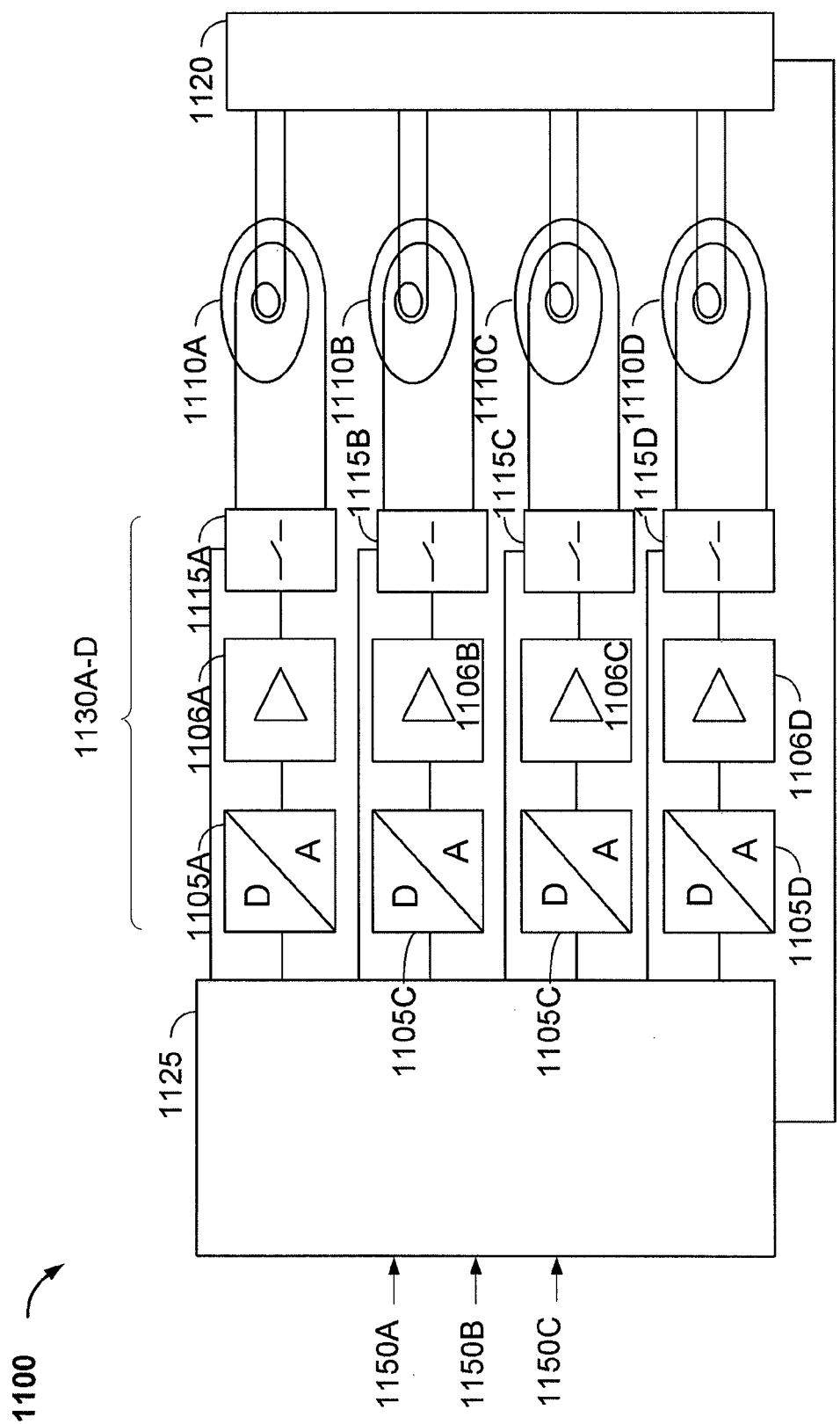
FIG. 11 depicts a block diagram of an embodiment of a magnetic field generator system in accordance with an exemplary embodiment of the generator system depicted in FIG. 9B.

FIG. 11 depicts a block diagram of an embodiment of a positioning magnetic field generator system in accordance with an exemplary embodiment of the generator system 1100. Signals 1150A-1150C are input into digital signal processor (DSP) 1125, each component representing input data such as positioning magnetic field signal parameters (e.g. level, frequency, ID) and being associated with one of an x-, y-, and z-direction. FIG. 11 also depicts the analog front end (AFE) channels 1130A-1130D of the generator system, the AFE channels 1130 comprising the digital/analog converter 1105A-1105D, the power amplifiers 1106A-1106D, the output protectors 1115A-1115D, and the generator coils 1110. The generator system 1100 also comprises a local test receiver 1120.

The DSP 1125 may be configured to generate and split signals (including information signals) into components as required to drive the four generator coils 1110 to generate at least two fields with desired polarization and frequency. Each AFE channel 1130A-1130D comprises a digital-to-analogue (D/A) converter 1105, a power amplifier 1106, and an output protector circuit 1115. The D/A-converter 1105 may convert a digital input signal to an analog signal to generate a positioning magnetic field signal. The converted analog signal from the D/A converter 1105 may be amplified by the power amplifier 1106 to a level as needed for the positioning magnetic field. The power amplifier 1106 may ensure that the generator coil currents and the generated magnetic fields are not altered by the mutual coupling that exists between the various combinations of generator coils 1110. As discussed above in relation to FIG. 5A, generator coil 1110 configurations with quasi-zero mutual coupling may not need the power amplifier 1106, because quasi-zero coupling configurations may allow the generator coils 1110 to be tuned on resonance allowing, for example, for better matching, more efficient field generation, and selectivity.

The output protector 1115 may provide protection for the power amplifier output 1106 from high induced voltages when the generator coils 1110 may be exposed to strong magnetic fields such as those generated by the IPT system during active power transfer. The output protector 1115 may comprise one or more voltage limiters and/or a switch for disconnecting generator coils 1110 from power amplifiers 1106 when an IPT coupler is active and magnetic field vectoring is not being used.

As discussed above in relation to the local test generator 820 of FIG. 8, the local test receiver 1120 may comprise sense coils of similar size and shape as the generator coils 1110 so that in some embodiments, the local test receiver 1120 may sense a magnetic field generated at each generator coil 1110. The local magnetic fields of each generator coil 1110 may then provide signals generated in response to the magnetic fields generated by the generator coils 1110. In some embodiments, each test coil (not individually labeled) that receives a generated magnetic field may be disposed in the space immediately surrounding a generator coil 1110. In some embodiments, the test coils may have a similar shape and/or size as the generator coils 1110. In some embodiments, the test coils may be of different shape and/or size as the generator coils 1110. In some embodiments, the local test receiver 1120 may be used to verify that the components of the generator system are functioning properly, including the AFE channels 1130 and may be used to calibrate and self-test the various components, which may be a safety requirement or a requirement by a standard.

Calibration and self-test function may serve to calibrate and check integrity of DSP 1125 outputs, AFE channels 1130 and generator coils 1110 with respect to their amplitude and phase response, thus to correct or eliminate vector errors introduced by AFE channels 1130 (for example, due to component tolerances, thermal drift, non-perfect characteristics, etc.). Such calibration and test function may be a safety requirement and may be performed frequently by DSP 1125. In the exemplary embodiment shown in FIG. 11, local test receiver 1120 is communicating with DSP 1125 and may be controlled by DSP 1125.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein. Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for sensing magnetic field components in a wireless power transfer system, comprising:
   a ferromagnetic magnetically permeable substrate;
   at least three co-planar coils configured to generate signals induced by a received magnetic field, the at least three coils disposed on the ferromagnetic magnetically permeable substrate, the ferromagnetic magnetically permeable substrate configured to alter the magnetic field that flows through the at least three coils;
   a conductive back plate disposed on the ferromagnetic magnetically permeable substrate on a side opposite the at least three co-planar coils; and
   a processing system operably connected to the coils and configured to generate at least two outputs, based on the signals generated by the coils, the outputs indicative of at least two vector components of the received magnetic field.

2. The apparatus of claim 1, wherein the processing system comprises a signal combiner and a detector to provide a vector output, the signal combiner configured to combine the signals generated by the coils and the detector configured to perform a non-linear operation on the signals to generate the vector output.

3. The apparatus of claim 2, wherein the signal combiner is configured to combine signals to produce a vector component of the vector output that is a maximum when a direction of the received magnetic field is perpendicular to a plane of the at least three coils.

4. The apparatus of claim 2, wherein the signal combiner is configured to combine signals to produce a vector component of the vector output that is a maximum when a direction of the received magnetic field is parallel to a plane of the at least three coils.

5. The apparatus of claim 2, wherein the signal combiner combines signals from a combination of at least two coils of the at least three coils to produce at least one of an x-, y-, or z-vector component output.

6. The apparatus of claim 1, wherein the at least three coils are positioned in a geometry providing at least one symmetry axis.

7. The apparatus of claim 1, wherein the one or more of the coils of the at least three coils overlap with another coil of the at least three coils.

8. The apparatus of claim 1, wherein the processing system is configured to generate three outputs based on the signals generated by the at least three coils, wherein each of the three outputs is indicative of one of the three vector components (Vx, Vy, Vz) of the received magnetic field.

9. The apparatus of claim 1, wherein the conductive back plate is configured to reduce a sensitivity of the at least three coils to the environment.

10. The apparatus of claim 1, wherein the at least three coils are positioned within or on a printed circuit board.

11. The apparatus of claim 10, wherein the printed circuit board, the at least three coils, and the ferromagnetic magnetically permeable substrate are positioned within an inductive power transfer coupler configured to perform inductive power transfer.

12. The apparatus of claim 1, wherein the ferromagnetic magnetically permeable substrate and the at least three co-planar coils are configured to be positioned within an inductive power transfer coupler configured to perform inductive power transfer.

13. A method of sensing magnetic field components in a wireless power transfer system, comprising:
   receiving a magnetic field via at least three co-planar coils disposed on a ferromagnetic magnetically permeable substrate;
   altering, via the ferromagnetic magnetically permeable substrate, the magnetic field that flows through the at least three co-planar coils;
   generating signals induced by the received magnetic field via the at least three coils; and
   generating, via a processing system, at least two outputs based on the signals generated by the at least three coils, the output comprising at least two vector components of the received magnetic field, wherein a conductive back plate is positioned on the ferromagnetic magnetically permeable substrate opposite of the coils.

14. The method of claim 13, wherein generating the at least two outputs comprises combining, via a signal combiner, signals generated by the at least three coils and performing non-linear operations on the signals to generate the vector output via a detector.

15. The method of claim 14, wherein combining signals generated by the at least three coils comprises combining the signals to produce a vector component of the vector output that is a maximum when a direction of the received magnetic field is perpendicular to a plane of the at least three coils.

16. The method of claim 14, wherein combining signals generated by the at least three coils comprises combining the signals to produce a vector component of the vector output that is a maximum when a direction of the received magnetic field is parallel to a plane of the at least three coils.

17. The method of claim 14, wherein combining signals comprises combining signals from a combination of at least two coils of the at least three coils to produce at least one of an x-, y-, or z-vector component output.

18. The method of claim 14, wherein performing non-linear operations comprises detecting at least one of an amplitude, signal level, and magnitude of a complex phase to obtain the output.

19. The method of claim 13, further comprising positioning the at least three coils in a geometry providing at least one symmetry axis.

20. The method of claim 13, further comprising positioning one or more of the at least three coils such that it overlaps with at least one other of the at least three coils.

21. The method of claim 13, wherein generating at least one output comprises generating three outputs based on the signals generated by the at least three coils, wherein each of the three outputs is indicative of one of the three vector components (Vx, Vy, Vz) of the received magnetic field.

22. The method of claim 13, further comprising electrically insulating and mechanically protecting the at least three coils positioned within or on a circuit board substrate.

23. The method of claim 22, wherein the ferromagnetic magnetically permeable substrate, the circuit board substrate, and the at least three co-planar coils are configured to be positioned within an inductive power transfer coupler configured to perform inductive power transfer.

24. The method of claim 13, wherein the ferromagnetic magnetically permeable substrate and the at least three co-planar coils are configured to be positioned within an inductive power transfer coupler configured to perform inductive power transfer.

25. The method of claim 13, further comprising reducing a sensitivity of the at least three coils to the environment via the conductive back plate.

26. An apparatus for sensing magnetic field components in a wireless power transfer system, comprising
   at least three co-planar coils disposed on a ferromagnetic magnetically permeable substrate, configured to generate signals induced by a received magnetic field, the ferromagnetic magnetically permeable substrate configured to alter the magnetic field that flows through the at least three coils;
   means for reducing a sensitivity of the at least three coils to an environment, the means for reducing a sensitivity positioned on the ferromagnetic magnetically permeable substrate opposite the coils; and
   means for generating at least two outputs based on the signals generated by the at least three co-planar coils, the output comprising at least two vector components of the received magnetic field.

27. The apparatus of claim 26, wherein the output generating means comprises means for combining signals generated by the at least three coils, and means for performing non-linear operations on the signals to generate the vector output.

28. The apparatus of claim 27, wherein the combining means comprising means for combining the signals to provide a vector component of the vector output that is a maximum when a direction of the received magnetic field is perpendicular to a plane of the at least three coils.

29. The apparatus of claim 27, wherein the combining means comprising means for combining the signals to provide a vector component of the vector output that is a maximum when a direction of the received magnetic field is parallel to a plane of the at least three coils.

30. The apparatus of claim 27, wherein the combining means comprising means for combining signals from a combination of at least two coils of the at least three coils to produce at least one of a x-, y-, or z-vector component output.

\* \* \* \* \*